(12) United States Patent
Miyajima

(10) Patent No.: US 8,421,154 B2
(45) Date of Patent: Apr. 16, 2013

(54) SEMICONDUCTOR DEVICE HAVING SUPER JUNCTION STRUCTURE AND METHOD FOR MANUFACTURING THE SAME

(75) Inventor: Takeshi Miyajima, Anjo (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 13/307,878

(22) Filed: Nov. 30, 2011

(65) Prior Publication Data

US 2012/0068298 A1    Mar. 22, 2012

Related U.S. Application Data

(62) Division of application No. 11/699,579, filed on Jan. 30, 2007, now Pat. No. 8,106,453.

(30) Foreign Application Priority Data

| Jan. 31, 2006 | (JP) | ................. 2006-023145 |
| Mar. 9, 2006 | (JP) | ................. 2006-063833 |
| Dec. 5, 2006 | (JP) | ................. 2006-328397 |

(51) Int. Cl.
*H01L 29/66* (2006.01)

(52) U.S. Cl.
USPC ....... 257/341; 257/328; 257/E27.02; 438/268

(58) Field of Classification Search .......... 257/335–342, 257/491–493
See application file for complete search history.

(56) References Cited

U.S. PATENT DOCUMENTS

| 6,475,864 B1 | 11/2002 | Sato et al. |
| 6,768,169 B2 | 7/2004 | Tihanyi |
| 6,821,824 B2 | 11/2004 | Minato et al. |
| 7,029,977 B2 | 4/2006 | Kishimoto et al. |
| 7,091,557 B2 | 8/2006 | Deboy |
| 7,105,387 B2 | 9/2006 | Minato et al. |
| 7,262,459 B2 | 8/2007 | Takahashi et al. |
| 7,535,056 B2 | 5/2009 | Komachi |
| 2003/0011046 A1 | 1/2003 | Qu |
| 2004/0016959 A1 | 1/2004 | Yamaguchi et al. |
| 2004/0108568 A1 | 6/2004 | Qu |
| 2005/0035401 A1 | 2/2005 | Yamaguchi et al. |
| 2007/0207597 A1 | 9/2007 | Takahashi et al. |

FOREIGN PATENT DOCUMENTS

| DE | 100 61 310 | 6/2002 |
| JP | A-2004-146689 | 5/2004 |

OTHER PUBLICATIONS

Office Action dated Jul. 1, 2008 in corresponding German patent application No. 10 2007 004 616.4-33 (and English translation).
Office Action dated Nov. 28, 2008 in corresponding Chinese patent application No. 2007100073746 (and English translation).
Office Action dated Mar. 12, 2010 from China Patent Office in corresponding CN application No. 200710007374.6 (and English translation).
Office Action dated Nov. 24, 2010 from German Patent Office in corresponding DE application No. 10 200 7004 616.4-33 (and English translation).
Office Action mailed May 8, 2012 in corresponding JP Application No. 2006-063833 (and English translation).
Office Action mailed May 22, 2012 in corresponding JP Application No. 2006-328397 (and English translation).

*Primary Examiner* — Eva Yan Montalvo
(74) *Attorney, Agent, or Firm* — Posz Law Group, PLC

(57) ABSTRACT

A semiconductor device having a super junction structure includes: multiple first columns extending in a current flowing direction; and multiple second columns extending in the current flowing direction. The first and second columns are alternately arranged in an alternating direction. Each first column provides a drift layer. The first and second columns have a boundary therebetween, from which a depletion layer expands in case of an off-state. At least one of the first columns and the second columns have an impurity dose, which is inhomogeneous by location with respect to the alternating direction.

11 Claims, 21 Drawing Sheets

SEMICONDUCTOR DEVICE HAVING SUPER JUNCTION STRUCTURE AND METHOD FOR MANUFACTURING THE SAME

CROSS REFERENCE TO RELATED APPLICATIONS

This application is a divisional of U.S. application Ser. No. 11/699,579 filed on Jan. 30, 2007, which is based on and claims priority to Japanese Patent Applications No. 2006-23145 filed on Jan. 31, 2006, No. 2006-63833 filed on Mar. 9, 2006 and No. 2006-328397 filed on Dec. 5, 2006, the disclosures of which are incorporated herein by reference.

FIELD OF THE INVENTION

The present invention relates to a semiconductor device having super junction structure and a method for manufacturing a semiconductor device having super junction structure.

BACKGROUND OF THE INVENTION

A substrate of super junction MOSFET is constructed by repeatedly arranging a PN column pair of one kind in a transistor forming area as disclosed in, for example, JP-A-2004-146689. As its result, in comparison with a conventional MOSFET, it is possible to reduce on-resistance by a reduction in drift resistance and perform high speed switching.

Although the high speed switching can be performed, an electric current between a drain and a source is suddenly interrupted at a switching time from an on-state to an off-state. Thus, the voltage between the drain and the source is greatly jumped up so that problems such as a degradation in breakdown robustness amount, radio noise generation, etc. are caused.

Further, a MOSFET having a super junction structure is disclosed in, for example, US Patent Application Publication No. 2005-0035401. The super junction structure is constructed by alternately arranging an N type impurity area and a P type impurity area constituting a PN column pair. In comparison with a conventional MOSFET, it is possible to reduce on-resistance by a reduction of drift resistance and perform high speed switching.

However, in the super junction MOSFET, the PN column pair is instantly depleted. Therefore, in comparison with the conventional MOSFET, although the high speed switching can be performed at high voltage operation, an electric current between a drain and a source is suddenly interrupted at a switching time from an on-state to an off-state. Therefore, the voltage between the drain and the source is greatly jumped up, and problems such as radio noise generation, a degradation in breakdown robustness amount, deterioration of recovery characteristics, etc. are caused.

Thus, it is required for a semiconductor device to restrain the jumping-up of the voltage at the switching time from an on-state to an off-state.

SUMMARY OF THE INVENTION

In view of the above-described problem, it is an object of the present disclosure to provide a semiconductor device having a super junction structure. It is another object of the present disclosure to provide a method for manufacturing a semiconductor device having a super junction structure.

According to a first aspect of the present disclosure, a semiconductor device having a super junction structure includes: a plurality of first columns having a first conductive type and extending in a current flowing direction; and a plurality of second columns having a second conductive type and extending in the current flowing direction. The first columns and the second columns are alternately arranged in an alternating direction perpendicular to the current flowing direction so that the super junction structure is provided. Each first column provides a drift layer in case of an on-state for flowing a current therethrough. The first columns and the second columns have a boundary between the first column and the second column, from which a depletion layer expands in case of an off-state. At least one of the first columns and the second columns have an impurity dose, which is inhomogeneous by location with respect to the alternating direction.

When the device switches from the on-state to the off-state, a timing of complete depleting the first and second columns deviates by location with respect to the alternating direction. Thus, voltage jump is reduced when the device switches to the off-state.

According to a second aspect of the present disclosure, a semiconductor device having a super junction structure includes: a plurality of first columns having a first conductive type and extending in a current flowing direction; and a plurality of second columns having a second conductive type and extending in the current flowing direction. The first columns and the second columns are alternately arranged in an alternating direction perpendicular to the current flowing direction so that the super junction structure is provided. Each first column provides a drift layer in case of an on-state for flowing a current therein. The first columns and the second columns have a boundary between the first column and the second column, from which a depletion layer expands in case of an off-state. At least one of the first columns and the second columns have an impurity dose, which is inhomogeneous by location with respect to the current flowing direction.

When the device switches from the on-state to the off-state, a timing of complete depleting the first and second columns deviates by location with respect to the current flowing direction. Thus, voltage jump is reduced when the device switches to the off-state.

According to a third aspect of the present disclosure, a method for manufacturing a semiconductor device having a super junction structure includes: preparing a semiconductor substrate having a first conductive type; forming a plurality of trenches in the substrate, wherein each trench has a constant width along with a first direction, and wherein a distance between neighboring two trenches along with the first direction includes at least a first distance and a second distance; forming an epitaxial film having a second conductive type on the substrate so that the trenches are filled with the epitaxial film; and flattening one side of the substrate, on which the epitaxial film is formed.

The above method provides the semiconductor device, in which voltage jump is reduced when the device switches to the off-state.

According to a fourth aspect of the present disclosure, a semiconductor device having a super junction structure includes: a plurality of first columns having a first conductive type and extending in a current flowing direction; and a plurality of second columns having a second conductive type and extending in the current flowing direction. The first columns and the second columns are alternately arranged in an alternating direction perpendicular to the current flowing direction so that the super junction structure is provided. Each first column provides a drift layer in case of an on-state for flowing a current therethrough. The first columns and the second columns have a boundary between the first column and the second column, from which a depletion layer expands in case of an off-state. Each of the first columns and the second columns have a stripe planar pattern on a plane perpendicular to the current flowing direction. At least one of the first columns and the second columns have a bridge portion, which connects one first or second column and a neighboring first or second column.

When the device switches from the on-state to the off-state, a timing of complete depleting the first and second columns deviates by location. Thus, voltage jump is reduced when the device switches to the off-state.

According to a fifth aspect of the present disclosure, a method for manufacturing a semiconductor device having a super junction structure includes: preparing a semiconductor substrate having a first conductive type; forming a plurality of trenches in the substrate, wherein each trench has a constant width along with a first direction, wherein the trenches have a constant distance between neighboring two trenches along with the first direction, and wherein each trench extends intermittently in a second direction, which is perpendicular to the first direction; and forming an epitaxial film having a second conductive type on the substrate so that the trenches are filled with the epitaxial film.

The above method provides the semiconductor device, in which voltage jump is reduced when the device switches to the off-state. Further, since the trenches have the constant distance between neighboring two trenches, and each trench extends intermittently in the second direction, a trench wall is prevented from inclining.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

First Embodiment Mode

A first embodiment mode for embodying the present invention will next be explained in accordance with the drawings.

Figure 1:
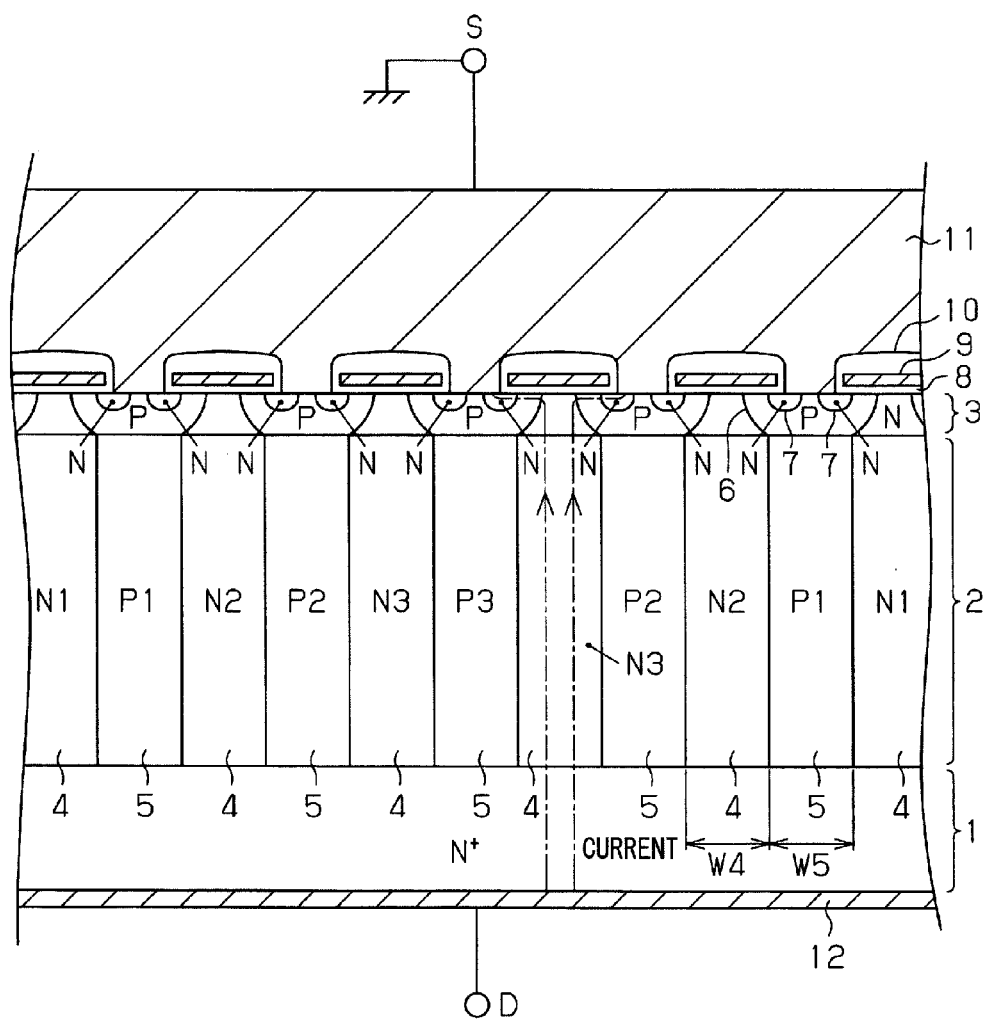
FIG. 1 is a cross sectional view showing a semiconductor device according to a first embodiment mode.

FIG. 1 is a longitudinal sectional view of a semiconductor device in this embodiment mode. This semiconductor device is a vertical type MOSFET, and an electric current is flowed in a longitudinal direction. Namely, the longitudinal direction is a flowing direction of the electric current, and a transversal direction is a direction perpendicular to the flowing direction of the electric current.

A silicon layer 2 is formed on an N$^+$ silicon substrate 1, and an N type silicon layer 3 is formed on the silicon layer 2. A semiconductor substrate is constructed by this laminating layer structural body. In the silicon layer 2 in the semiconductor substrate, an impurity area (N column) 4 of N type extending in the longitudinal direction, and an impurity area (P column) 5 of P type similarly extending in the longitudinal direction are arranged adjacently and alternately in the transversal direction. A column pair (PN column pair) is constructed from the impurity area 4 of N type and the impurity area 5 of P type. Thus, a super junction structure is formed. At an on-state time, the N type impurity area 4 in the PN column pair becomes a drift layer and the electric current is flowed. At an off-state time, a depletion layer is spread from an interface of the N type impurity area 4 and the P type impurity area 5.

In the above N type silicon layer 3, a channel forming area 6 of P type is formed so as to reach the impurity area 5 of P type. An N type source area 7 is formed in a surface layer portion within the channel forming area 6 of P type. In a part for exposing the channel forming area 6 of P type on an upper face of the N type silicon layer 3, a gate electrode 9 is formed through a gate oxide film 8 as a gate insulating film. The gate electrode 9 is covered with a silicon oxide film 10. A source electrode 11 is formed on the upper face of the N type silicon layer 3. This source electrode 11 is electrically connected to the source area 7 and the channel forming area 6. A drain electrode 12 is formed on a lower face (rear face) of the $N^+$ silicon substrate 1.

The transistor is turned on by applying a positive electric potential to the gate electrode 9 in a state in which the source electrode 11 is set to a ground electric potential and a positive electric potential is applied to the drain electrode 12. At a transistor on-state time, as shown in FIG. 1, the electric current is flowed from the drain electrode 12 to the source electrode 11 through the $N^+$ silicon substrate 1, the N type impurity area 4, an N type area (3), a part (inverting layer) opposed to the gate electrode 9 in the channel forming area 6, and the source area 7.

Figure 2:
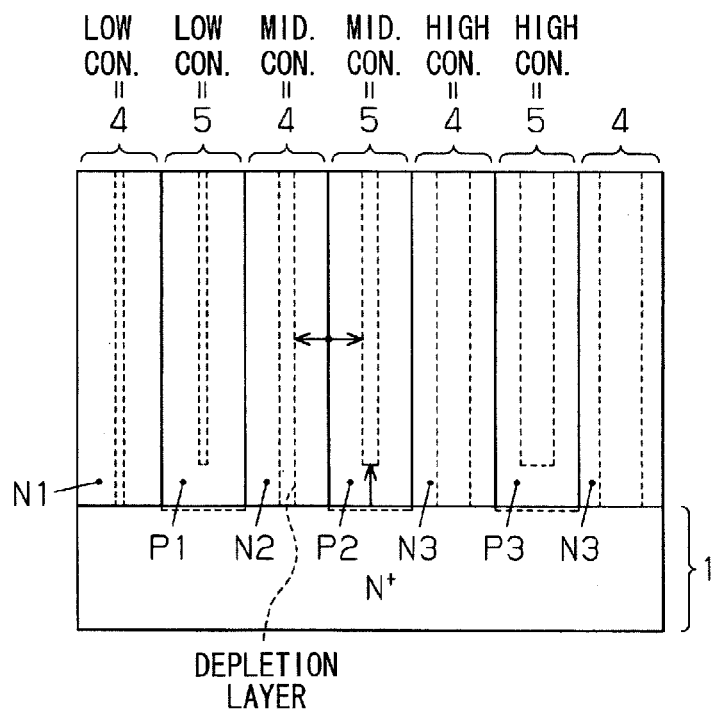
FIG. 2 is a partially enlarged cross sectional view showing a super junction structure in the device shown in FIG. 1.

On the other hand, the transistor is turned off when the gate electrode 9 is set to a ground electric potential from the transistor on-state (a state in which the source electrode 11 is set to a ground electric potential and the drain electrode 12 is set to a positive electric potential and the gate electrode 9 is set to a positive electric potential). As shown in FIG. 2, the depletion layer is spread from the interface of the N type impurity area 4 and the P type impurity area 5.

Here, in this embodiment mode, an impurity dose in the transversal direction of the PN column pair in an active area (transistor forming area) of the transistor in the semiconductor substrate is ununiformed in accordance with places. Namely, the total amount (dose) of impurities of both areas 4, 5 in the transversal direction is differently set in accordance with places. Concretely, in FIG. 1, the width W4 of each N type impurity area 4 is constantly set, and the width W5 of each P type impurity area 5 is also constantly set. The impurity concentration of the N type impurity area 4 is set to three kinds of N1, N2, N3, and the impurity concentration of the P type impurity area 5 is set to three kinds of P1, P2, P3.

Thus, the width W4 of each N type impurity area 4 is equally set, and the width W5 of each P type impurity area 5 is equally set. Further, the impurity concentration of the N type impurity area 4 and the impurity concentration of the P type impurity area 5 are differently set in accordance with places in the transversal direction. Thus, the impurity dose of the PN column pair in the transversal direction is ununiformed in accordance with places.

Figure 3:
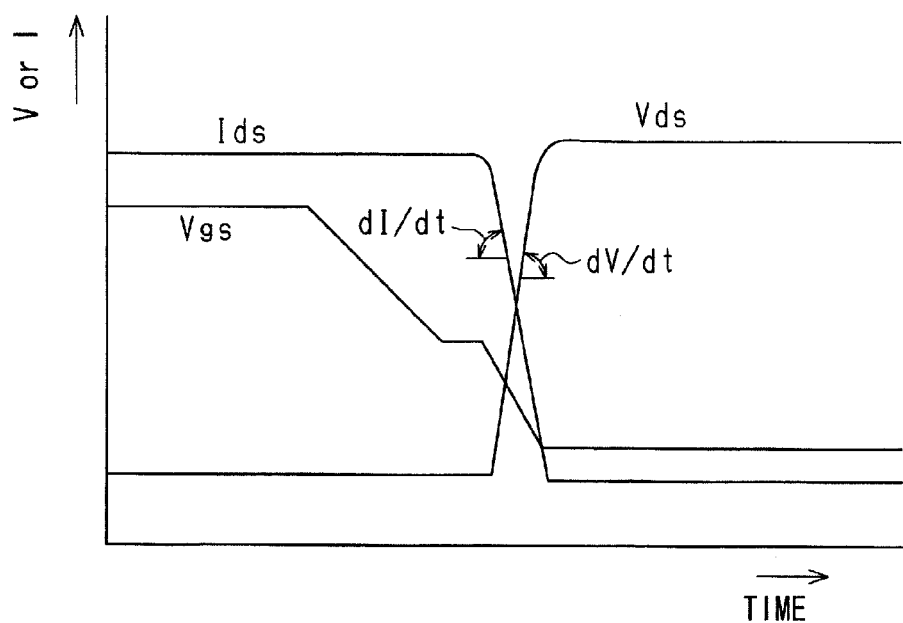
FIG. 3 is a graph showing a voltage waveform and a current waveform in the device shown in FIG. 1 in case of switching.

Thus, as shown in FIG. 2, a spread speed of the depletion layer shown by a broken line within this figure is different (the spread speed is fast as concentration is low) in accordance with a difference in impurity concentration, and a balance of the impurity doses of P type and N type is different in accordance with places. Therefore, timing for perfectly depleting the PN column pair is shift within a face (transversal direction), and it is prevented that all PN columns are simultaneously turned off. As its result, as shown in FIG. 3, a changing ratio (dI/dt) with respect to an electric current Ids between the drain and the source at a switching time from an on-state to an off-state is reduced, and jumping-up of a voltage Vds between the drain and the source at the switching time from an on-state to an off-state can be deterred.

Figure 19:
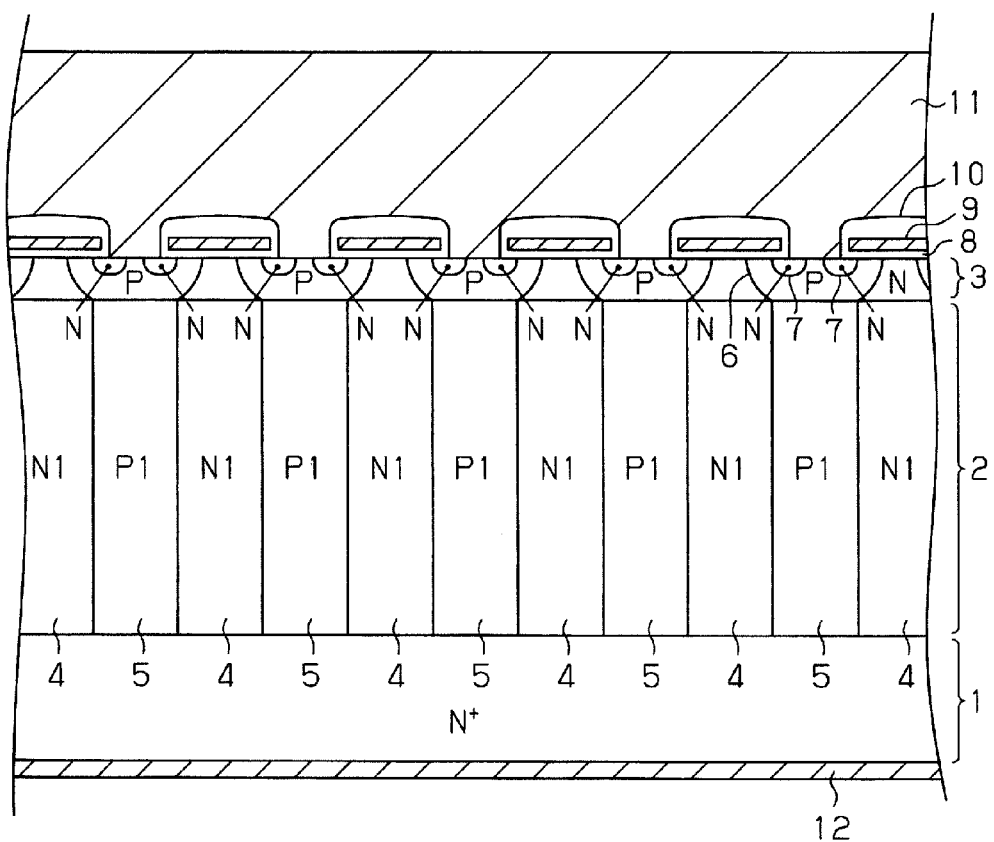
FIG. 19 is a cross sectional view showing a semiconductor device as a comparison of the first embodiment mode.
Figure 20:
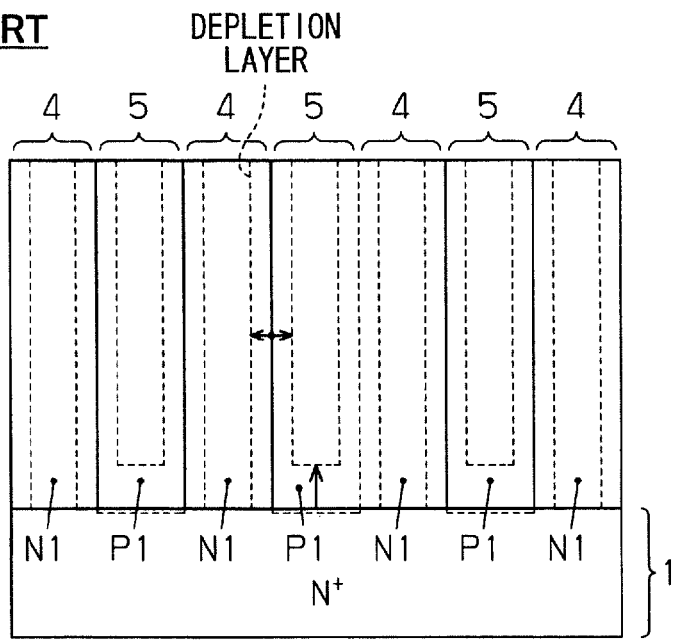
FIGS. 20-22 are partially enlarged cross sectional views showing a depletion layer in the device shown in FIG. 19.
Figure 21:
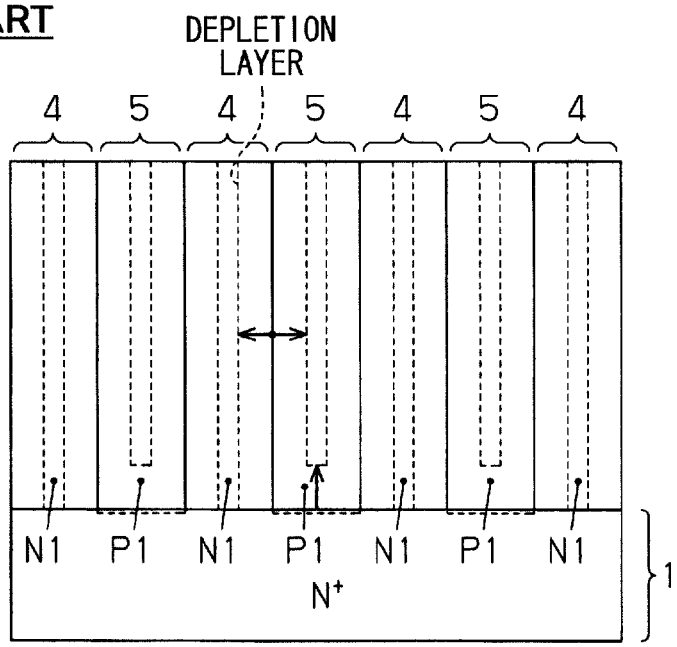
Figure 22:
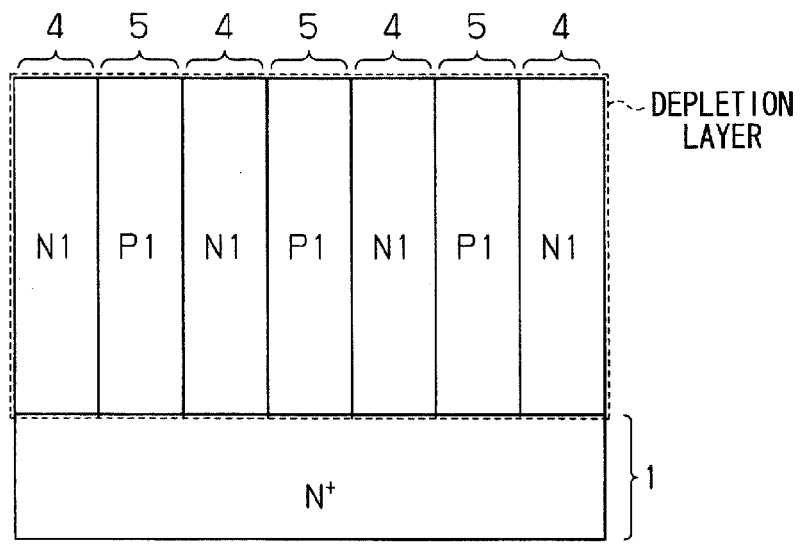
Figure 23:
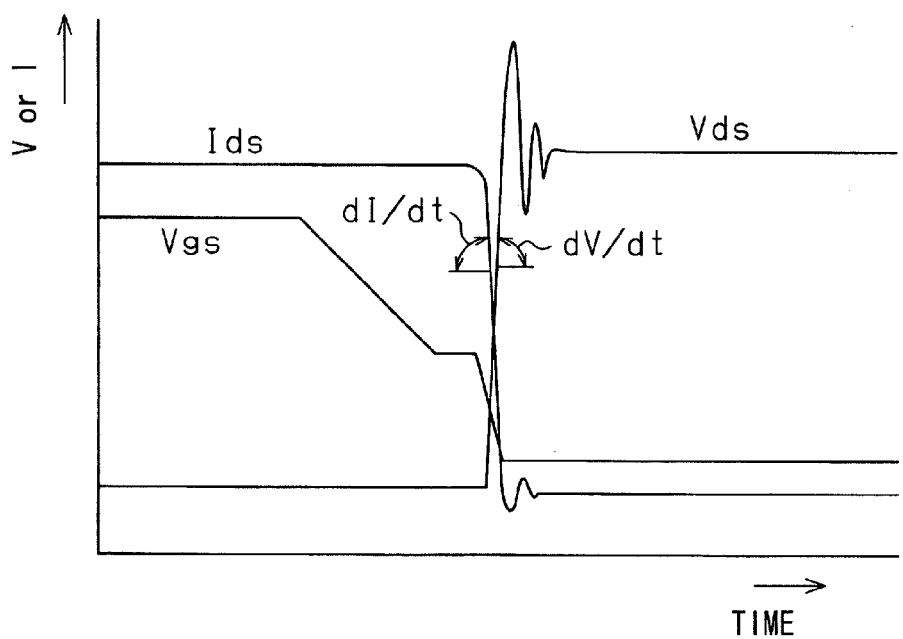
FIG. 23 is a graph showing a voltage waveform and a current waveform of the device shown in FIG. 19 in case of switching.

FIG. 19 is a longitudinal sectional view in a super junction MOSFET for comparison. In FIG. 19, a PN column pair of one kind constructed by only an N type impurity area (N column) 4 of impurity concentration N1, and a P type impurity area (P column) 5 of impurity concentration P1 is arranged in an active area (transistor forming area). A super junction structure is constructed by the PN column pair of the same construction (N1 and P1) irrespective of places. At the switching time from an on-state of the transistor to an off-state (switching-off time), as shown in FIG. 20, depletion formation is similarly advanced in each column pair after the depletion formation is started. As shown in FIG. 21, the depletion formation is similarly further advanced in each column pair. As shown in FIG. 22, the depletion formation is simultaneously completed in each column pair. In this operation, as shown in FIG. 23, at the switching time from an on-state to an off-state, the changing ratio (dI/dt) with respect to the electric current Ids between the drain and the source is large, and jumping-up of the voltage Vds between the drain and the source is generated.

In contrast to this, in this embodiment mode, the super junction structure is constructed from the N type impurity area (N column) 4 of N1, N2, N3 in impurity concentration, and the P type impurity area (P column) 5 of P1, P2, P3 in impurity concentration. Therefore, the super junction structure is constructed by PN column pairs of two kinds or more. Thus, plural kinds of combinations of adjacent PN column pairs can be formed, and the balance of impurity doses of P type and N type is different in accordance with places in the active area (transistor forming area). Thus, at the switching time (switching-off time) from an on-state of the transistor to an off-state, timing for perfectly depleting the PN column pair can be shifted within a transistor forming face (transversal direction). Therefore, it is prevented that all transistor cells are simultaneously turned off. Thus, as shown in FIG. 3, it is possible to deter the jumping-up of the voltage Vds between the drain and the source at the switching time from an on-state to an off-state. Namely, the timing of the perfect depletion formation is shifted in the active area by using the PN column pairs of two kinds or more different in impurity dose. Thus, the changing ratio (dI/dt) with respect to the electric current Ids between the drain and the source is reduced, and the jumping-up of the voltage Vds between the drain and the source can be prevented.

In accordance with the above embodiment mode, the following effects can be obtained.

In the semiconductor device (vertical type MOSFET) having the super junction structure, the impurity dose of the column pair in the transversal direction in the active area of the semiconductor device is ununiformed in accordance with places. Accordingly, timing for perfectly depleting the column pair (PN column pair) constructed by the N type impurity area 4 and the P type impurity area 5 is shifted in the transversal direction at the switching time (switching-off time) from an on-state to an off-state. Thus, the jumping-up of the voltage at the switching time from an on-state to an off-state can be restrained.

Further, in the general power MOSFET, gate resistance is increased to restrain a radio noise generated at the switching time so that a gate input waveform is dulled to cope with this noise. However, generated heat is increased, and compactness of a product is limited. Further, in the super junction MOSFET, the jumping-up of the voltage at a perfect depletion forming time becomes a problem. Therefore, no radio noise countermeasure can be taken by only gate waveform control. In contrast to this, the radio noise in a super junction element can be reduced by ununiforming the impurity dose of the column pair in accordance with places. Furthermore, this reduction can be realized without increasing the generated heat.

Second Embodiment Mode

A second embodiment mode will next be explained with a focus on a different point from the first embodiment mode.

Figure 4:
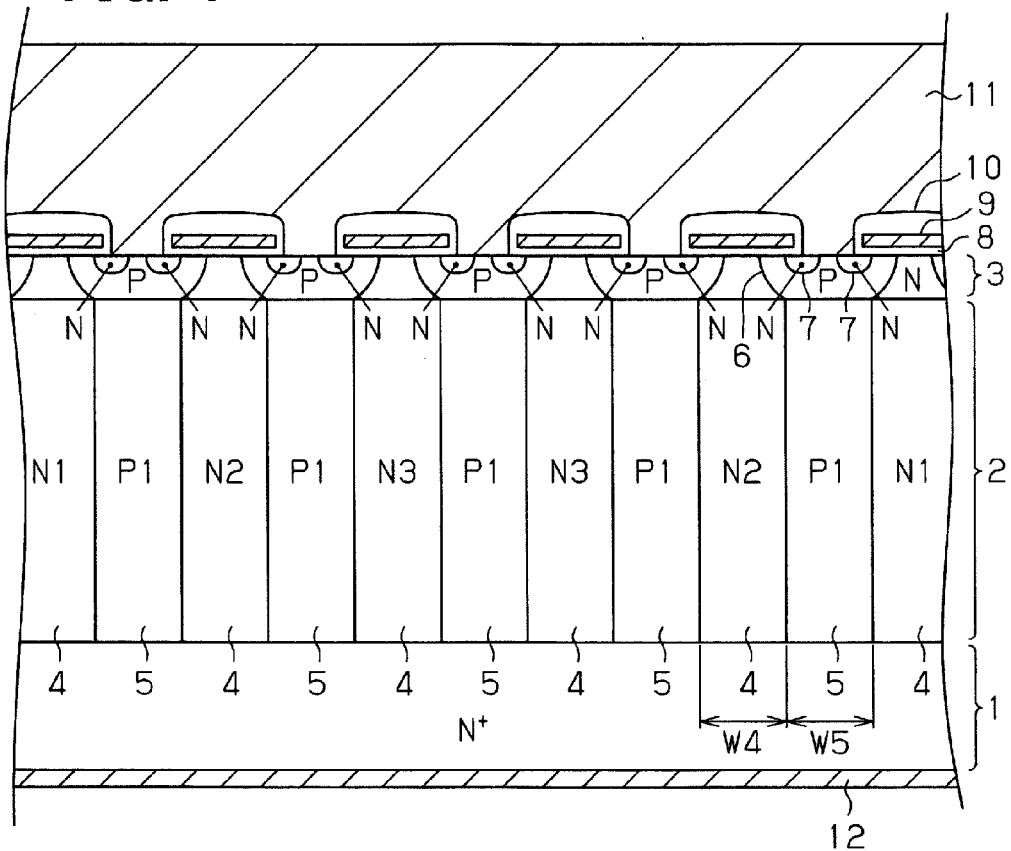
FIG. 4 is a cross sectional view showing a semiconductor device according to a second embodiment mode.

FIG. 4 is a longitudinal sectional view of a semiconductor device in this embodiment mode instead of FIG. 1. This semiconductor device is also a vertical MOSFET, and has the super junction structure.

The width W4 of each N type impurity area 4 is constantly set, and the width W5 of each P type impurity area 5 is also constantly set. The impurity concentration of the N type impurity area 4 is set to three kinds of N1, N2, N3, and the impurity concentration of the P type impurity area 5 is set to one kind of P1. Namely, FIG. 4 differs from FIG. 1 in that the concentration of the N type impurity area (N column) 4 is three kinds of N1, N2, N3, and the concentration of the P type impurity area (P column) 5 is one kind of P1.

Thus, the width W4 of each N type impurity area 4 is equally set, and the width W5 of each P type impurity area 5 is equally set. Further, the impurity concentration of each P type impurity area 5 is equally set, and the impurity concentration of the N type impurity area 4 is differently set in accordance with places in the transversal direction. Thus, the impurity dose in the transversal direction of the column pair is ununiformed in accordance with places.

Figure 5:
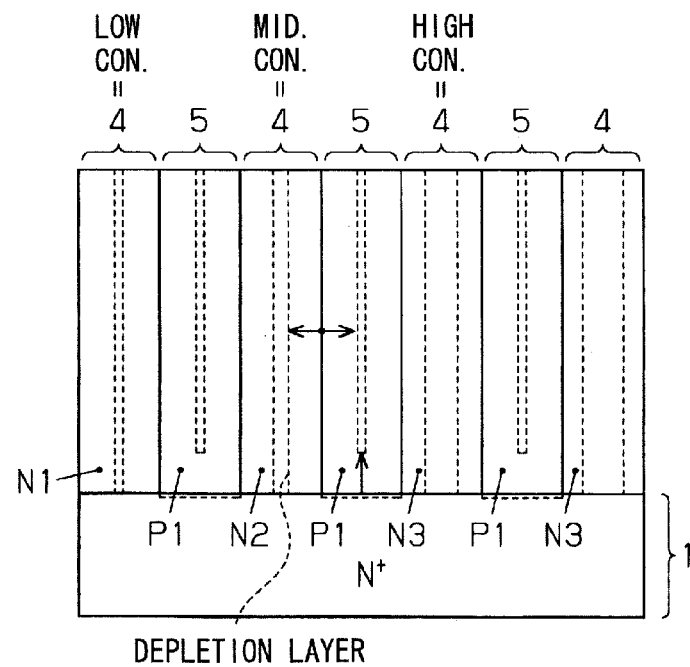
FIG. 5 is a partially enlarged cross sectional view showing a super junction structure in the device shown in FIG. 4.

Thus, as shown in FIG. 5, at the switching time (switching-off time) from an on-state of the transistor to an off-state, with respect to the spread of a depletion layer shown by a broken line in this figure, timing for perfectly depleting the PN column pair can be shifted within a transistor forming face (transversal direction). Therefore, the jumping-up of the voltage at the switching time from an on-state to an off-state can be restrained.

Thus, the impurity concentration of only the N type impurity area (N column) 4 may be also changed, or the impurity concentration of only the P type impurity area (P column) 5 may be also changed.

Third Embodiment Mode

A third embodiment mode will next be explained with a focus on a different point from the first embodiment mode.

Figure 6:
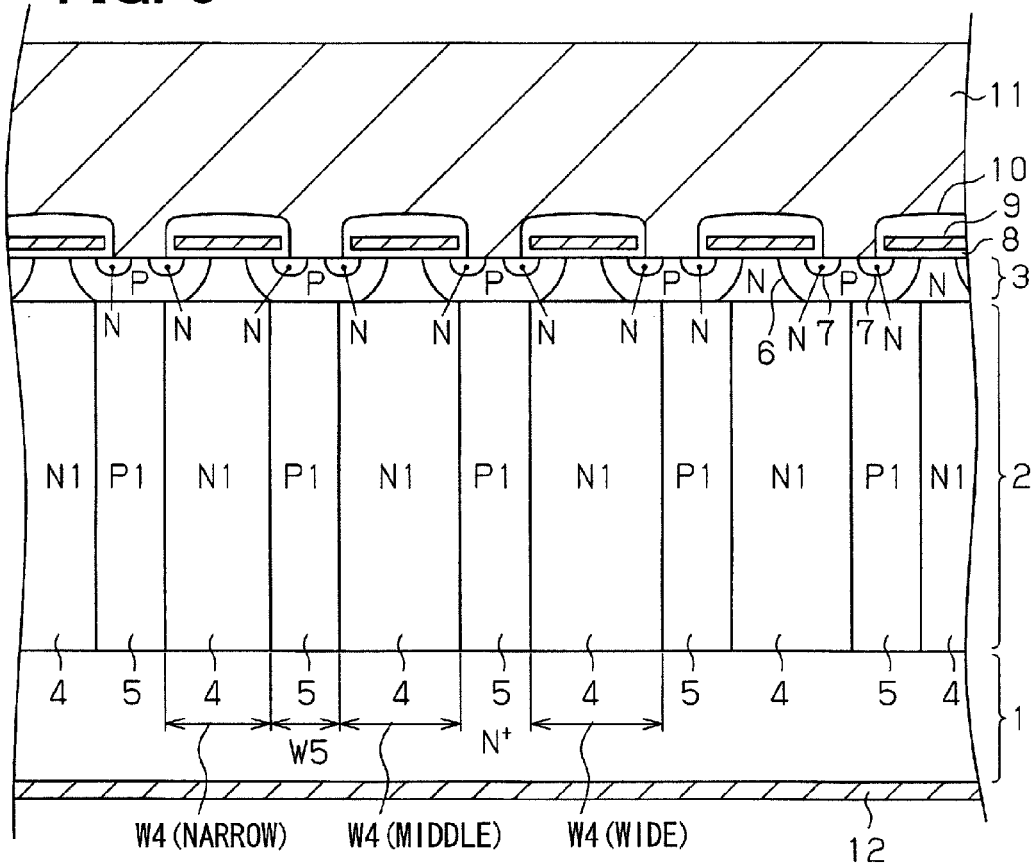
FIG. 6 is a cross sectional view showing a semiconductor device according to a third embodiment mode.

FIG. 6 is a longitudinal sectional view of a semiconductor device in this embodiment mode instead of FIG. 1. This semiconductor device is also a vertical type MOSFET, and has the super junction structure.

The impurity concentration of the N type impurity area 4 is set to one kind of N1, and the impurity concentration of the P type impurity area 5 is set to one kind of P1. The width W5 of each P type impurity area 5 is constantly set, and the width W4 of the N type impurity area 4 is set to three kinds.

Thus, the impurity concentration of each N type impurity area 4 is equally set, and the impurity concentration of each P type impurity area 5 is equally set. Further, the width W5 of each P type impurity area 5 is equally set, and the width W4 of the N type impurity area 4 is differently set in accordance with places in the transversal direction. Thus, the impurity dose in the transversal direction of the column pair is ununiformed in accordance with places.

Figure 7:
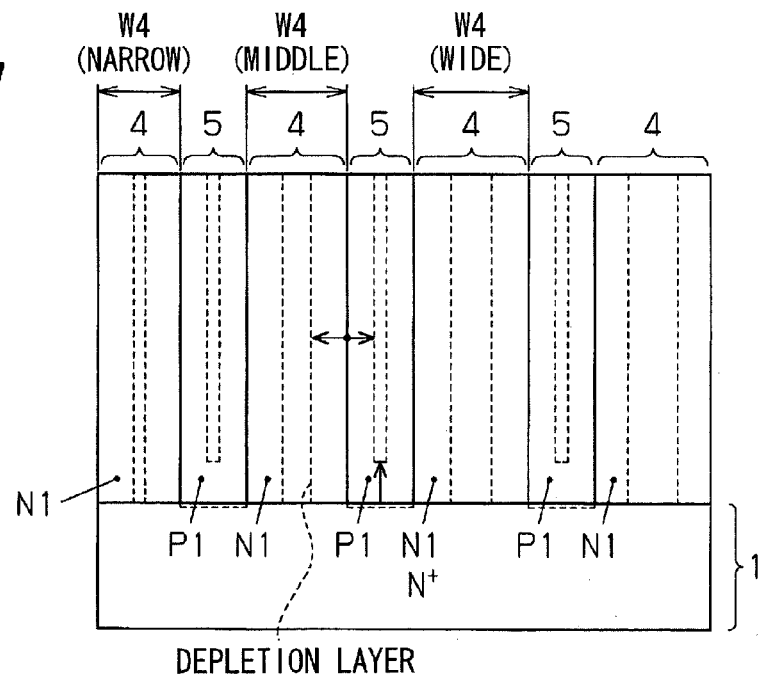
FIG. 7 is a partially enlarged cross sectional view showing a super junction structure in the device shown in FIG. 6.

Thus, as shown in FIG. 7, at the switching time (switching-off time) from an on-state of the transistor to an off-state, with respect to the spread of a depletion layer shown by a broken line in this figure, timing for perfectly depleting the PN column pair can be shifted within a transistor forming face (transversal direction). Therefore, the jumping-up of the voltage at the switching time from an on-state to an off-state can be restrained.

Next, a manufacturing method of the semiconductor substrate having this super junction structure will be explained.

Figure 8:
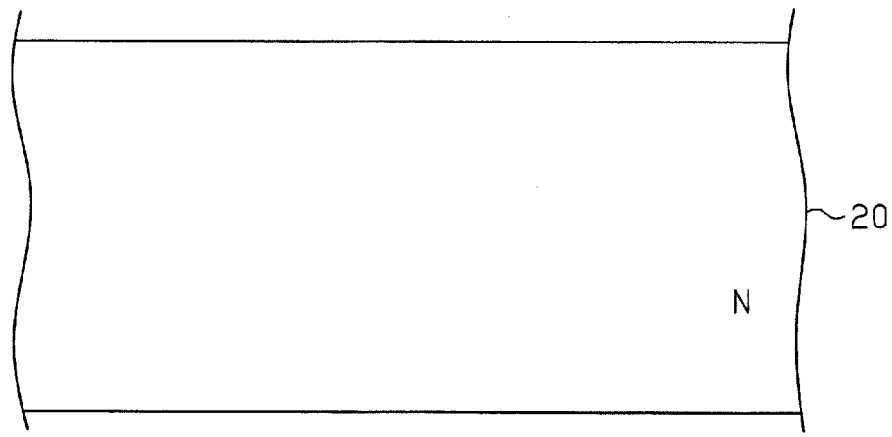
FIGS. 8-11 are cross sectional views explaining a method for manufacturing the semiconductor device shown in FIG. 6.
Figure 9:
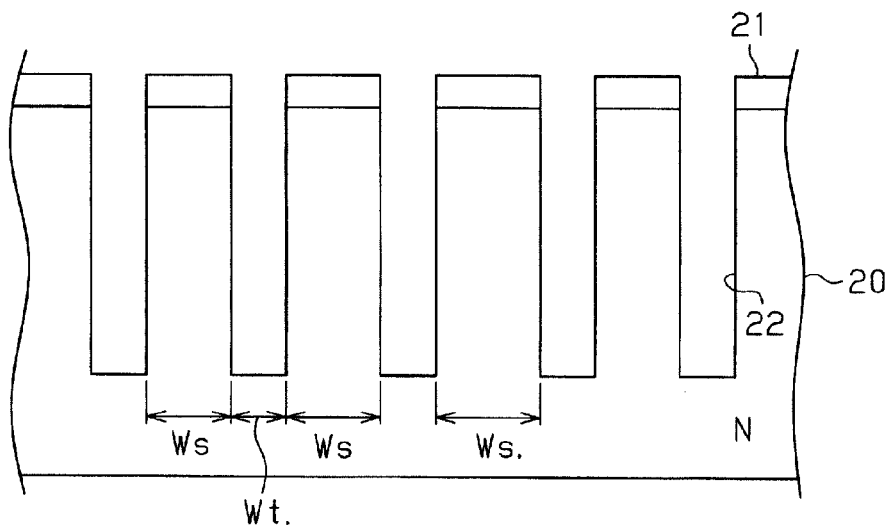

As shown in FIG. 8, an N type silicon wafer 20 as an N type semiconductor substrate is prepared. As shown in FIG. 9, a trench 22 is formed by performing ion etching using a mask 21 within a wafer face with respect to this wafer 20. In forming the trench, a groove width Wt of the trench 22 is set to be uniformed (constantly set), and a remaining width Ws is set to become two kinds or more.

Figure 10:
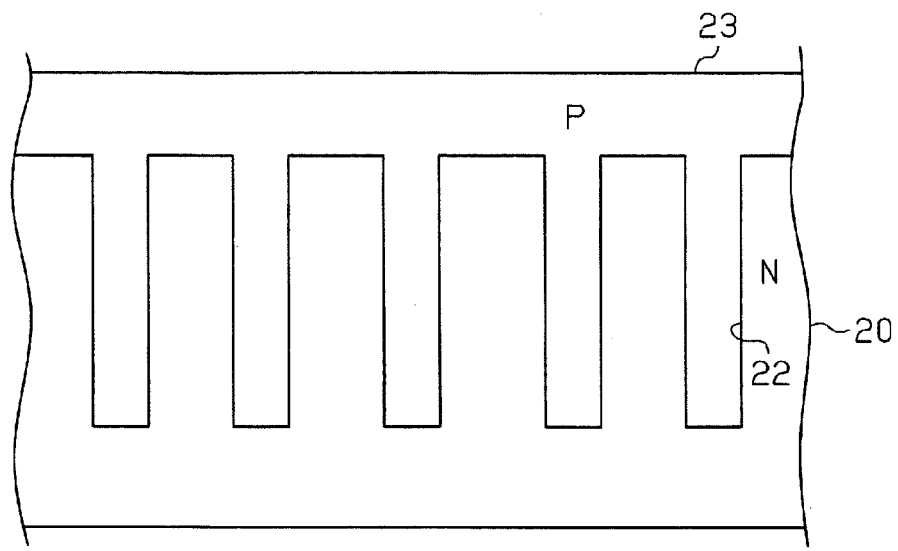
Figure 11:
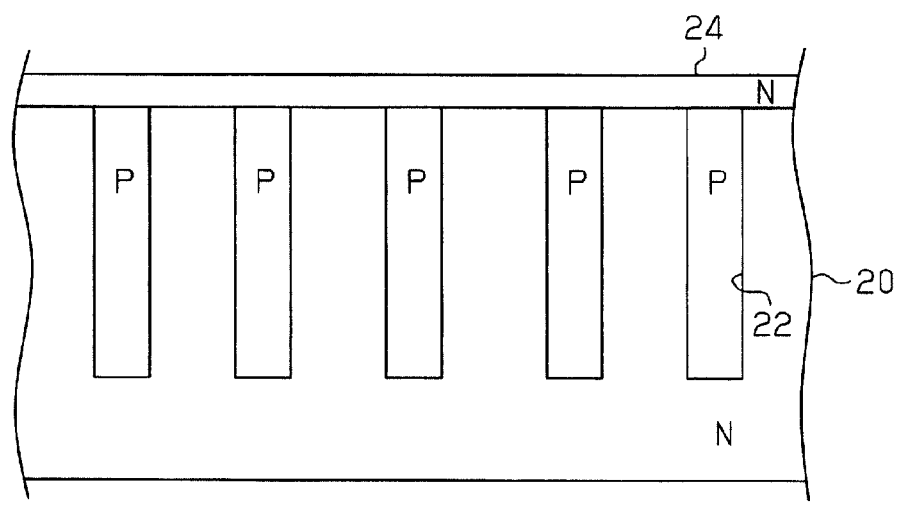

Thereafter, as shown in FIG. 10, an epitaxial film 23 of P type is formed on the N type silicon wafer 20, and the trench 22 is buried by the epitaxial film 23. Thereafter, a main face side (upper face side) of the N type silicon wafer 20, i.e., the upper face side of the epitaxial film 23 is polished and flattened. This polishing is performed until the silicon wafer 20 is exposed. Further, as shown in FIG. 11, an N type epitaxial film 24 is formed on the upper face of the N type silicon wafer 20. A surface silicon layer of N type may be also formed by implanting ions onto the upper face of the N type silicon wafer 20 instead of the formation of the N type epitaxial film 24 on the upper face of the N type silicon wafer 20.

Further, a rear face (lower face) of the N type silicon wafer 20 is polished until the vicinity of the trench 22, and an $N^+$ silicon substrate is stuck to this polishing face. An $N^+$ silicon layer may be also formed on the rear face of the N type silicon wafer 20 by implanting ions from the rear face (lower face) of the N type silicon wafer 20 instead of the polishing of the rear face of the N type silicon wafer 20 and the sticking of the $N^+$ silicon substrate.

A vertical type MOSFET shown in FIG. 6 is manufactured by using the semiconductor substrate (the semiconductor substrate having the super junction structure) formed in this way. Namely, a P type channel forming area 6, an N type source area 7, a gate oxide film 8, a gate electrode 9, a silicon oxide film 10, a source electrode 11 and a drain electrode 12 are formed. Thus, the super junction MOSFET of FIG. 6 is completed.

Figure 12:
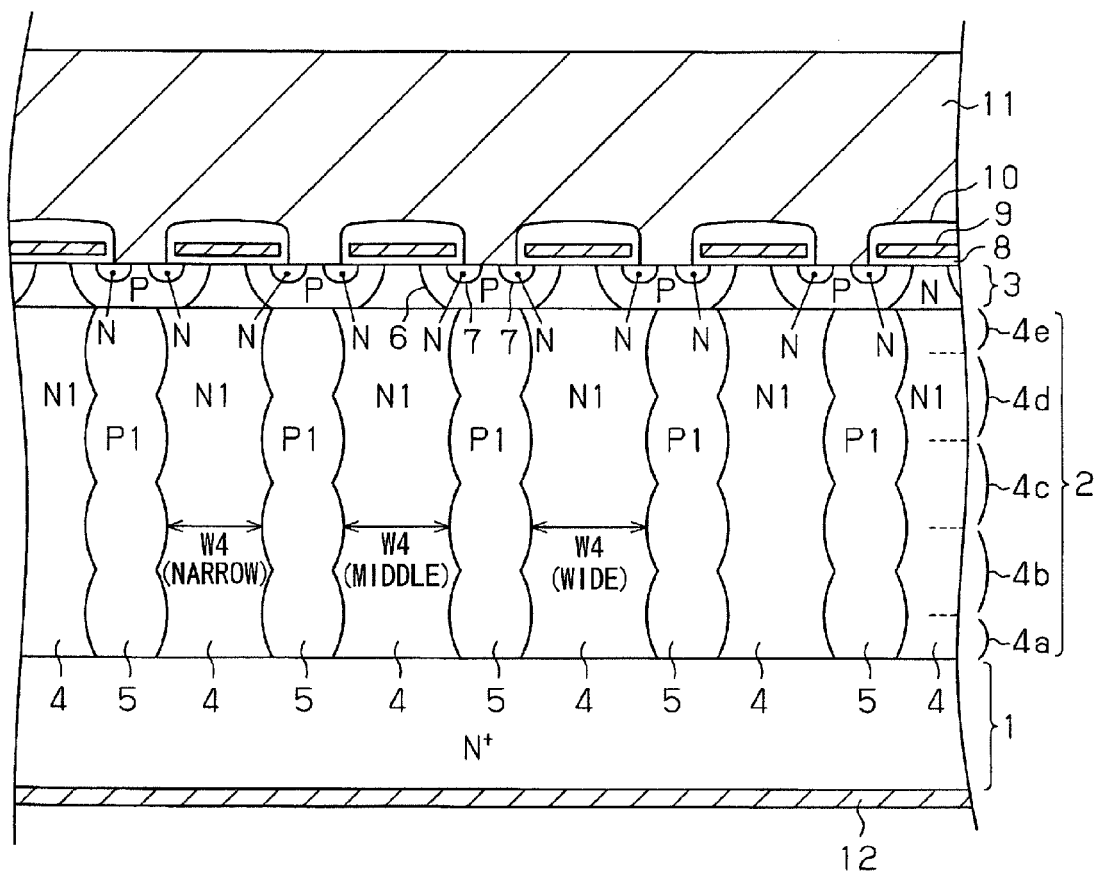
FIG. 12 is a cross sectional view explaining another method for manufacturing the semiconductor device shown in FIG. 6.

As another manufacturing method, as shown in FIG. 12, a PN column pair may be also made by repeating formation of N type epitaxial films 4a, 4b, 4c, 4d, 4e and the P type impurity area 5 using the ion implantation (and diffusion). Namely, the N type epitaxial film 4a is formed on the $N^+$ silicon substrate 1, and the P type impurity area 5 is formed in a predetermined area of this N type epitaxial film 4a. Subsequently, the N type epitaxial film 4b is formed on the N type epitaxial film 4a, and the P type impurity area 5 is formed in this N type epitaxial film 4b. Thereafter, this process is repeated and the N type impurity area 4 and the P type impurity area 5 are extended and arranged in the longitudinal direction.

Further, the groove width Wt may be also changed instead of the change of the remaining width Ws in FIG. 9. Namely, the remaining width Ws may be also set to be uniformed (constantly set), and the groove width Wt of the trench 22 may be also set to become two kinds or more.

Fourth Embodiment Mode

Next, a fourth embodiment mode will be explained with a focus on a different point from the first embodiment mode.

Figure 13:
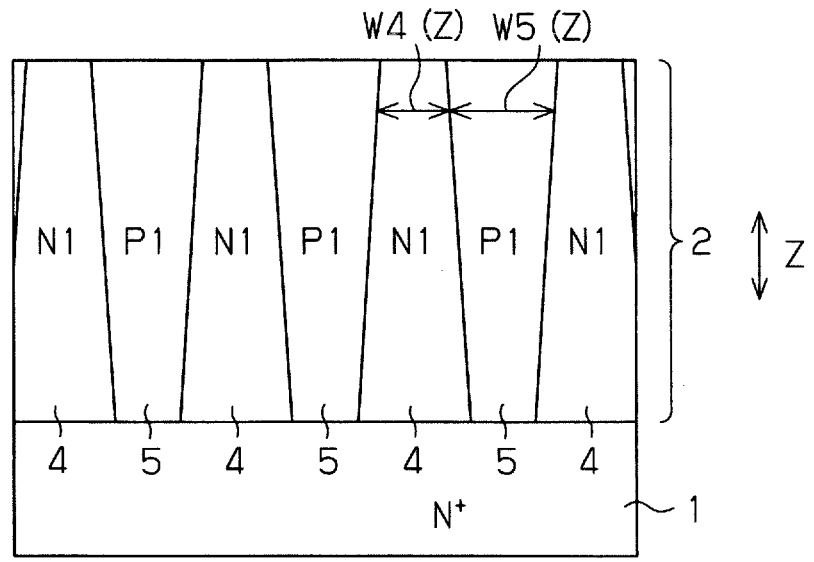
FIG. 13 is a partially enlarged cross sectional view showing a super junction structure in a semiconductor device according to a fourth embodiment mode.

FIG. 13 shows a PN column pair in this embodiment mode. The other constructions are the same as FIG. 1, and their explanations are therefore omitted.

In the first to third embodiment modes, the dose is changed in a column unit (impurity area unit). However, in this embodiment mode, an impurity dose difference is formed in the longitudinal direction within a column. Namely, the impurity dose of the column pair in the longitudinal direction (the flowing direction of an electric current) Z in the active area of the semiconductor device is ununiformed in accordance with places (i.e., depth).

Concretely, the impurity concentration of the N type impurity area 4 is set to one kind of N1, and the impurity concentration of the P type impurity area 5 is set to one kind of P1. The width W4 (Z) in the longitudinal direction Z with respect to the N type impurity area 4 is widest in a lower end portion, and is linearly narrowed toward an upper side. The width W5 (Z) in the longitudinal direction Z with respect to the P type impurity area 5 is narrowest in a lower end portion and is linearly widened toward an upper side.

Thus, the impurity concentration of each N type impurity area 4 is equally set, and the impurity concentration of each P type impurity area 5 is equally set. Further, the width W4 in the longitudinal direction with respect to the N type impurity area 4, and the width W5 in the longitudinal direction with respect to the P type impurity area 5 are differently set in accordance with places (depth) in the longitudinal direction. Thus, the impurity dose in the longitudinal direction of the column pair is ununiformed in accordance with places.

Figure 14:
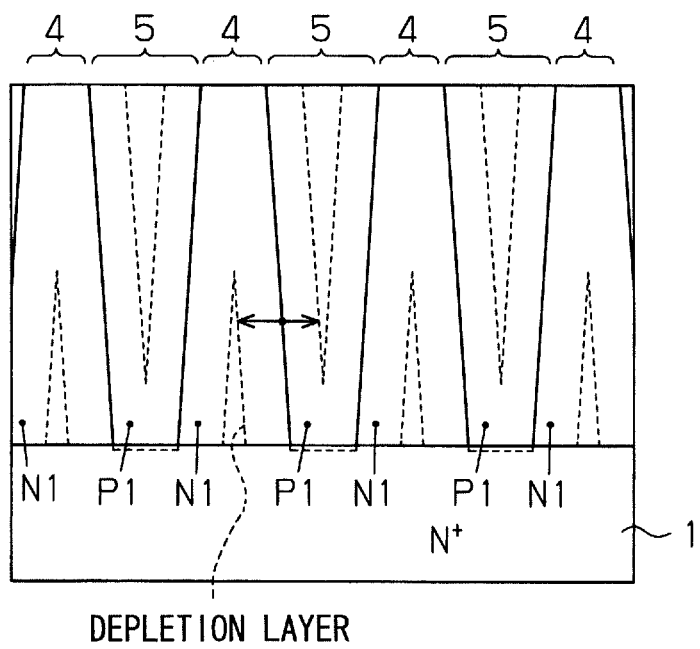
FIG. 14 is a partially enlarged cross sectional view showing a depletion layer in the super junction structure in FIG. 13.

Thus, as shown in FIG. 14, at the switching time (switching-off time) from an on-state of the transistor to an off-state, with respect to the spread of a depletion layer shown by a broken line within this figure, timing for perfectly depleting the PN column pair can be shifted according to the flowing direction of an electric current. Therefore, the changing ratio of the electric current at the switching time from an on-state to an off-state is reduced, and the jumping-up of the voltage can be restrained.

Figure 15:
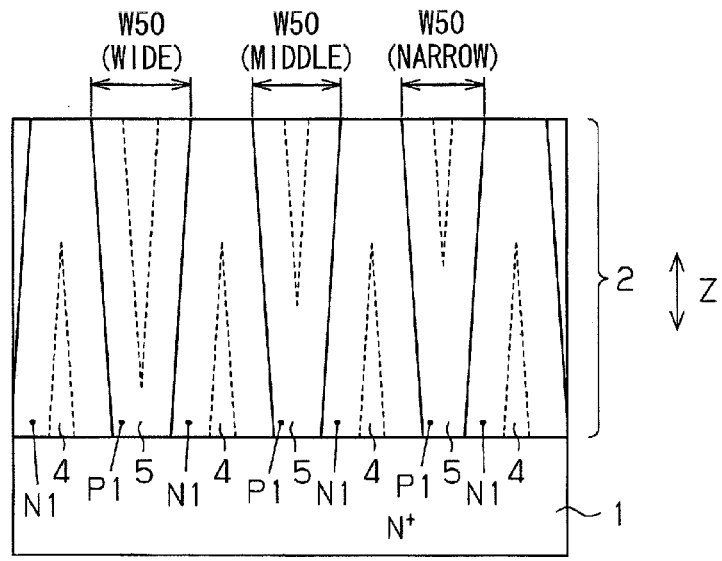
FIG. 15 is a partially enlarged cross sectional view showing a super junction structure in a semiconductor device according to a modification of the fourth embodiment mode.

As shown in FIG. 15 instead of FIG. 13, the width in the longitudinal direction of the N type impurity area 4 and the width in the longitudinal direction of the P type impurity area 5 may be also differently set in accordance with places (depth) in the longitudinal direction. Further, the width (width in the transversal direction of the P type impurity area 5 in FIG. 15) in the transversal direction with respect to areas 4, 5 may be also differently set in each of areas 4, 5 (each P type impurity area 5 in FIG. 15). In FIG. 15, the width in the transversal direction of the P type impurity area 5 is differently set in each area 5. However, the width in the transversal direction of the N type impurity area 4 may be also differently set in each area 4, or the width in the transversal direction with respect to both the N type impurity area 4 and the P type impurity area 5 may be also differently set in both respective areas 4, 5.

The above embodiment mode may be also set as follows.

An epitaxial wafer formed by laminating a silicon layer 2 of a low impurity concentration in a high impurity concentration silicon substrate 1 may be also used and a bulk substrate may be also used as the silicon wafer in FIG. 1, etc.

Further, as a making method of the PN column (N type impurity area 4 and P type impurity area 5), the trench may be also buried by implanting ions from a trench side wall after the trench formation. Further, a method for burying an impurity doped material (e.g., oxide) within the trench after the trench formation, and diffusing impurities by heat treatment from the impurity doped material to a trench side wall side may be also adopted as the making method of the PN column. Otherwise, as the making method of the PN column, the column may be also merely made by the ion implantation and the diffusion without forming the trench.

As a method for ununiforming the impurity dose of the column pair in a direction perpendicular to the flowing direction of the electric current in accordance with places, at least one of the width W4 of the N type impurity area 4, the width W5 of the P type impurity area 5, the impurity concentration of the N type impurity area 4 and the impurity concentration of the P type impurity area 5 may be differently set in accordance with places in the direction perpendicular to the flowing direction of the electric current in a wide sense.

Figure 16:
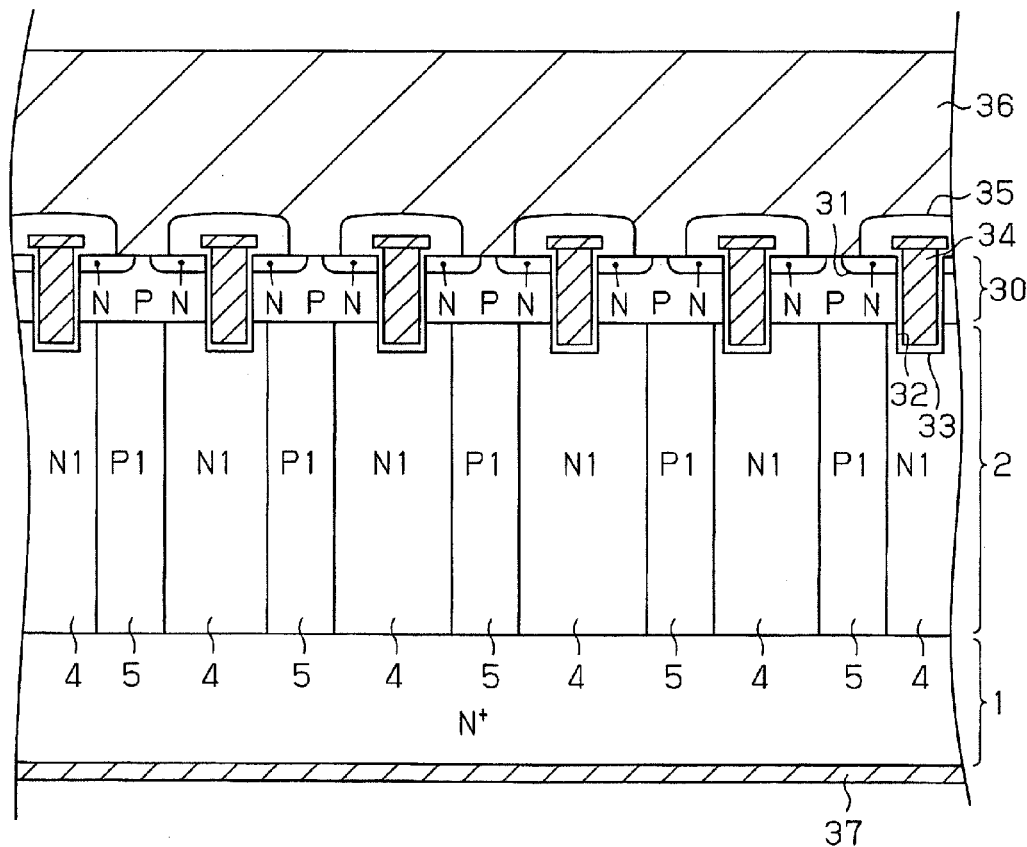
FIG. 16 is a cross sectional view showing another semiconductor device according to a first modification of the third embodiment mode.

MOSFET of the planar type has been explained as an example, but similar effects are also obtained in a concave type and a trench type. FIG. 16 shows one example in the case of a trench gate type MOSFET. In FIG. 16, an N type source area 31 is formed in a surface layer portion of a P type silicon layer 30. In the P type silicon layer 30, a trench 32 is formed so as to pass through the source area 31 and the P type silicon layer 30. A gate electrode 34 is formed within the trench 32 through a gate oxide film 33. The gate electrode 34 is covered with a silicon oxide film 35, and a source electrode 36 is formed thereon. Further, a drain electrode 37 is formed on a rear face of the substrate 1.

Figure 17:
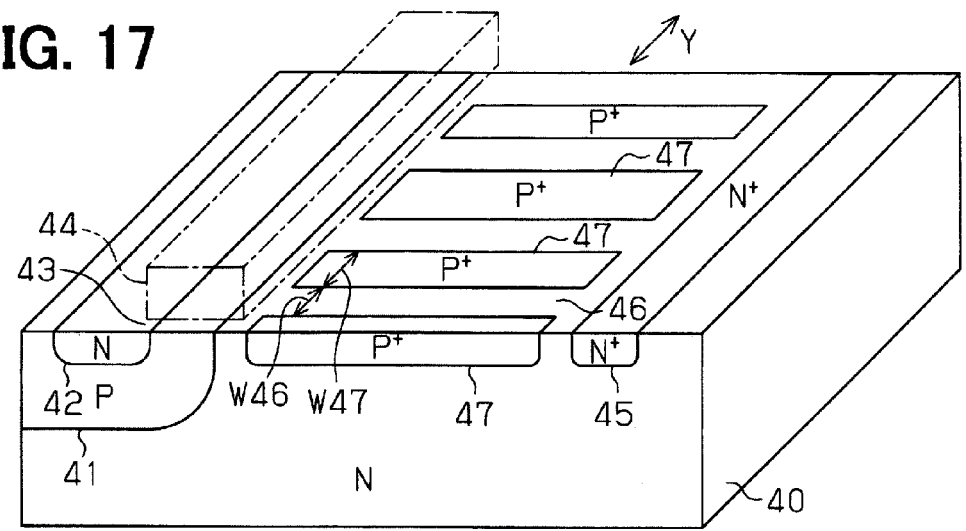
FIG. 17 is a perspective view showing further another semiconductor device according to a second modification of the third embodiment mode.

Further, the above embodiments may be also applied to a lateral MOSFET. FIG. 17 shows one example in the case of the lateral MOSFET. In FIG. 17, a P type channel forming area 41 is formed in a surface layer portion on the upper face of an N type silicon substrate 40. An N type source area 42 is formed in a surface layer portion within this channel forming area 41. A gate electrode 44 is formed through a gate oxide film 43 in an exposed part of the channel forming area 41 on the upper face of the substrate 40. Further, an N$^+$ drain area 45 is formed in a surface layer portion in a position separated from the P type channel forming area 41 on the upper face of the N type silicon substrate 40. The P type channel forming area 41 and the N$^+$ drain area 45 are respectively formed in a band shape, and are formed in parallel at a constant interval.

An N type impurity area 46 extending in the transversal direction (the flowing direction of an electric current) and a P type impurity area 47 similarly extending in the transversal direction (the flowing direction of the electric current) are adjacently alternately arranged in a surface layer portion on the upper face of the N type silicon substrate 40 between the P type channel forming area 41 and the N$^+$ drain area 45.

Here, for example, the impurity concentration of each N type impurity area 46 is equally set, and the impurity concentration of each P type impurity area 47 is equally set. The width W46 of each N type impurity area 46 is equally set, and the width W47 of the P type impurity area 47 is differently set in accordance with places in the transversal direction (more particularly, in direction Y within FIG. 17). Thus, the impurity dose in the transversal direction (more particularly, direction Y within FIG. 17) of the column pair is ununiformed in accordance with places.

Further, the above embodiments may be also applied to IGBT and a diode in addition to MOSFET.

In the explanation made so far, the first electric conductivity type is the N type and the second electric conductivity type is the P type. However, conversely, the first electric conductivity type may be also the P type, and the second electric conductivity type may be also the N type.

Next, optimization of the impurity dose when the impurity dose is ununiformed in accordance with places will be referred.

Figure 18:
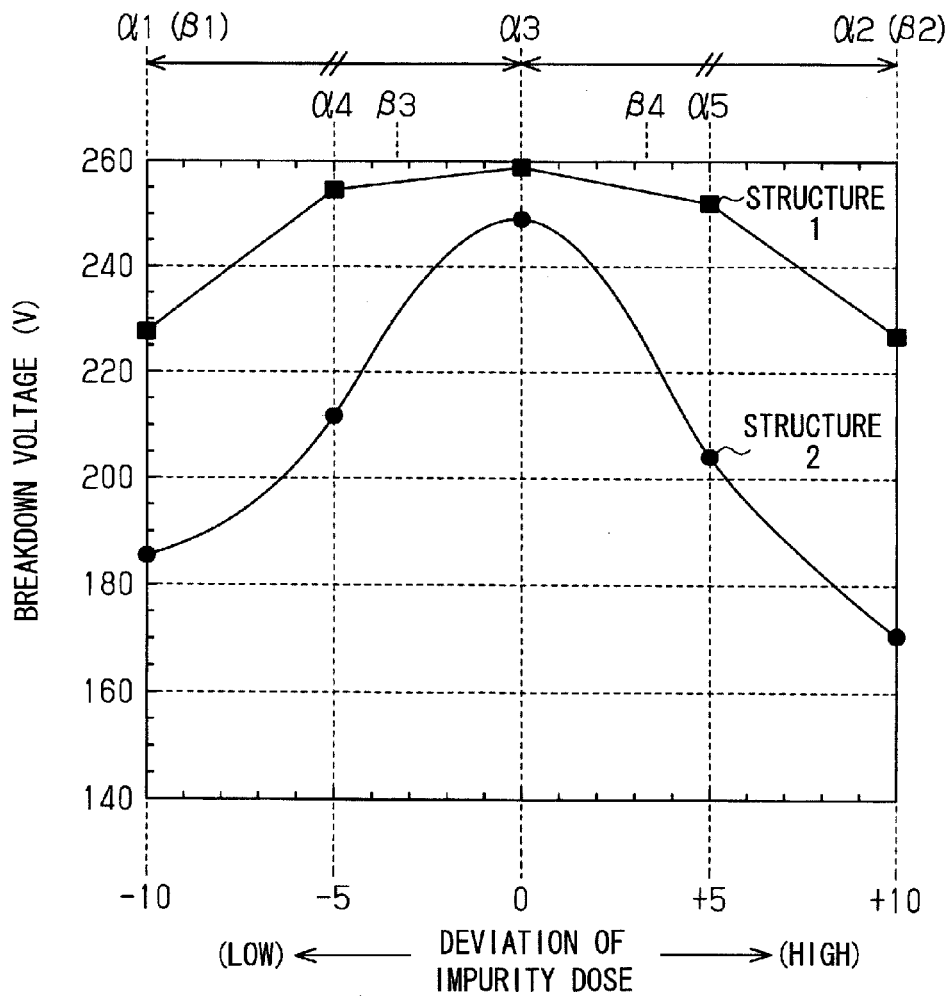
FIG. 18 is a graph showing a relationship between a deviation of impurity surface concentration and a breakdown voltage.

FIG. 18 shows the relation of the impurity dose and an element withstand voltage.

In FIG. 18, structures 1, 2 different in element structure are used, and a withstand voltage measurement is made by differently setting the impurity dose in structures 1, 2 (e.g., the structure of FIG. 4 and the structure of FIG. 6 are set as structures 1, 2). More concretely, for example, the withstand voltage measurement is made in a semiconductor device in which all portions set to three kinds of concentrations N1, N2, N3 in the structure of FIG. 4 are set to concentration N1. The withstand voltage measurement is made in a semiconductor device in which all these portions are set to concentration N2.

The withstand voltage measurement is made in a semiconductor device in which all these portions are set to concentration N3. Further, for example, in the structure of FIG. 6, the withstand voltage measurement is made in a semiconductor device in which all portions set to three kinds of widths W4 (small), W4 (middle) and W4 (large) in the structure of FIG. 6 are set to width W4 (small). The withstand voltage measurement is made in a semiconductor device in which all these portions are set to width W4 (middle). The withstand voltage measurement is made in a semiconductor device in which all these portions are set to width W4 (large).

In FIG. 18, the element withstand voltage is reduced even when the element withstand voltage is shifted positively and negatively, i.e., to any one of a high impurity dose side and a low impurity dose side from the impurity dose attaining a maximum of the element withstand voltage. Accordingly, characteristics of about left-right symmetry are shown. This tendency is the same even when the element structure is changed.

Therefore, when the impurity dose is set to two kinds, the impurity dose attaining a maximum in withstand voltage is set to a reference, and two points shifted positively and negatively by the same amount and approximately having an equal withstand voltage are selectively determined. Concretely, for example, in FIG. 18, impurity doses α1, α2 of two kinds are shifted positively and negatively by the same amount from the impurity dose attaining a maximum in withstand voltage, and are set. Thus, jumping-up of a voltage at an off-state time can be reduced without locally reducing the element withstand voltage. Namely, when the element withstand voltage is merely reduced in accordance with places, there is a possibility that electric current concentration is caused at a breakdown time, and results in an element breakdown. However, the electric current concentration is avoided and the element breakdown can be prevented at the breakdown time without concentrating the electric current by selectively determining two points approximately having an equal withstand voltage.

When the impurity dose is set to three kinds or more, the impurity dose is selectively determined from two points shifted positively and negatively by the same amount, and an area nipped by these two points. Concretely, for example, in FIG. 18, with respect to three kinds of impurity doses α1, α2, α3, impurity doses α1, α2 are shifted positively and negatively by the same amount from the impurity dose attaining a maximum in withstand voltage, and are set. Impurity dose α3 is set in an area nipped by impurity doses α1, α2. Impurity dose α3 is preferably centrally set in the area nipped by impurity doses α1, α2. Similarly, in FIG. 18, with respect to four kinds of impurity doses β1, β2, β3, β4, impurity doses β1, β2 are shifted positively and negatively by the same amount from the impurity dose attaining a maximum in withstand voltage, and are set. Impurity doses β3, β4 are set in an area nipped by impurity doses β1, β2. Impurity doses β3, β4 are preferably set so as to become impurity doses trisected in the area nipped by impurity doses β1, β2. Similarly, in FIG. 18, with respect to five kinds of impurity doses α1, α2, α3, α4, α5, impurity doses α1, α2 are positively and negatively shifted by the same amount from the impurity dose attaining a maximum in withstand voltage, and are set. Impurity doses α3, α4, α5 are set in an area nipped by impurity doses α1, α2. Impurity doses α3, α4, α5 are preferably set so as to become impurity doses quartered in the area nipped by impurity doses α1, α2.

The three kinds or more also include a kind continuously changed.

As mentioned above, in each embodiment mode described so far, it is possible to prevent the element withstand voltage from being locally reduced when the impurity dose is set to two kinds so as to ununiform the impurity dose in accordance with places, and impurity doses having an equal shift amount are set on a high impurity dose side and a low impurity dose side with respect to the impurity dose attaining a maximum in withstand voltage. Further, in each embodiment mode described so far, it is possible to prevent the element withstand voltage from being locally reduced when the impurity dose is set to three kinds or more so as to ununiform the impurity dose in accordance with places, and impurity doses having an equal shift amount are set on the high impurity dose side and the low impurity dose side with respect to the impurity dose attaining a maximum in withstand voltage, and the remaining impurity doses are set in an area nipped therebetween.

Fifth Embodiment Mode

A fifth embodiment mode for embodying the present invention will next be explained in accordance with the drawings.

Figure 24:
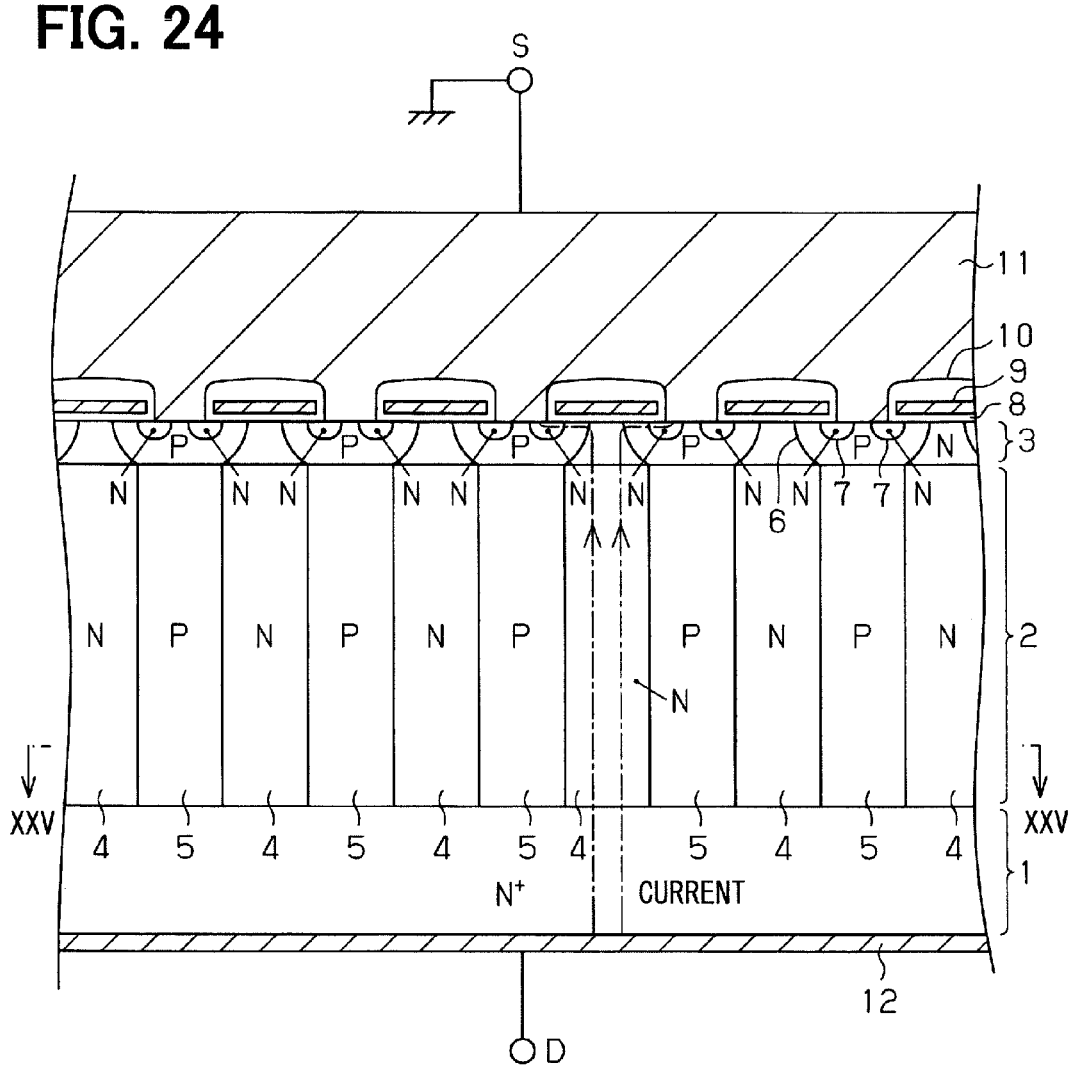
FIG. 24 is a cross sectional view showing a semiconductor device according to a fifth embodiment mode.

FIG. 24 is a longitudinal sectional view of a semiconductor device in this embodiment mode. This semiconductor device is a vertical type MOSFET, and an electric current is flowed in a longitudinal direction. Namely, the longitudinal direction is a flowing direction of the electric current, and the transversal direction is a direction perpendicular to the flowing direction of the electric current.

Figure 25:
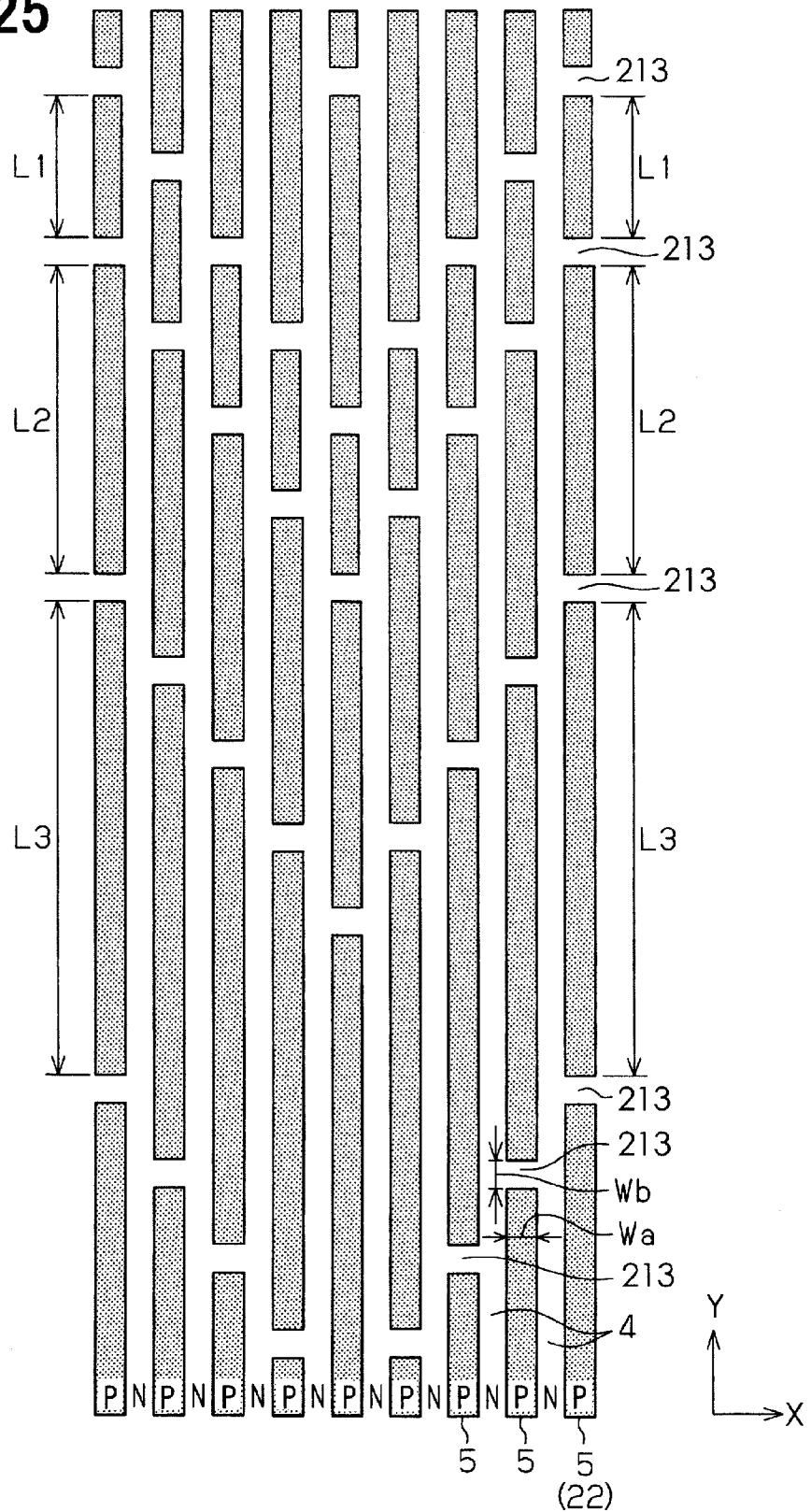
FIG. 25 is a cross sectional view showing the device taken along line XXV-XXV in FIG. 24.

FIG. 25 is a transversal sectional view on line XXV-XXV of FIG. 24, and shows the structure of a cross section in a super junction structure portion.

In FIG. 24, a silicon layer 2 is formed on an N$^+$ silicon substrate 1, and an N type silicon layer 3 is formed on the silicon layer 2. A semiconductor substrate is constructed by this laminating layer structural body. In the silicon layer 2 in the semiconductor substrate, an impurity area (N column) 4 of N type extending in the longitudinal direction, and an impurity area (P column) 5 of P type similarly extending in the longitudinal direction are arranged adjacently and alternately in the transversal direction. A column pair (PN column pair) is constructed from the impurity area 4 of N type and the impurity area 5 of P type. Thus, a super junction structure is formed. At an on-state time, the N type impurity area 4 in the PN column pair becomes a drift layer and the electric current is flowed. At an off-state time, a depletion layer is spread from an interface of the N type impurity area 4 and the P type impurity area 5.

In the above N type silicon layer 3, a channel forming area 6 of P type is formed so as to reach the impurity area 5 of P type. An N type source area 7 is formed in a surface layer portion within the channel forming area 6 of P type. In a part for exposing the channel forming area 6 of P type on an upper face of the N type silicon layer 3, a gate electrode 9 is formed through a gate oxide film 8 as a gate insulating film. The gate electrode 9 is covered with a silicon oxide film 10. A source electrode 11 is formed on the upper face of the N type silicon layer 3. This source electrode 11 is electrically connected to the source area 7 and the channel forming area 6. A drain electrode 12 is formed on a lower face (rear face) of the N$^+$ silicon substrate 1.

The transistor is turned on by applying a positive electric potential to the gate electrode 9 in a state in which the source electrode 11 is set to a ground electric potential and a positive electric potential is applied to the drain electrode 12. At a transistor on-state time, as shown in FIG. 24, the electric current is flowed from the drain electrode 12 to the source electrode 11 through the N$^+$ silicon substrate 1, the N type impurity area 4, an N type area (3), a part (inverting layer) opposed to the gate electrode 9 in the channel forming area 6, and the source area 7.

On the other hand, the transistor is turned off when the gate electrode 9 is set to a ground electric potential from the transistor on-state (a state in which the source electrode 11 is set to a ground electric potential and the drain electrode 12 is set to a positive electric potential and the gate electrode 9 is set to a positive electric potential). The depletion layer is spread from the interface of the N type impurity area 4 and the P type impurity area 5.

Here, in this embodiment mode, as shown in FIG. 25, an impurity area (N column) 4 of N type and an impurity area (P column) 5 of P type constituting a column pair in an active area of the transistor are formed in a band shape as a cross sectional shape, and are alternately arranged in parallel in the same direction (direction Y). Further, N type impurity areas (N column) 4 adjacent to each other are bridged. Namely, with respect to the adjacent impurity areas (N column) 4 of N type, a bridge portion 213 of a constant width is formed at a predetermined interval. More particularly, the bridge portion 213 is regularly arranged within a chip, i.e., in plane X-Y of FIG. 25. Further, the width Wb of the bridge portion 213 is set to the width Wa of the impurity area 5 nipped between the bridged impurity areas 4 or less (Wb≦Wa). Further, plural bridge portions 213 are arranged in an extending direction (direction Y) of the impurity area 4 with respect to the adjacent impurity areas 4, and the length L between the bridge portions 213 is differently set in accordance with places. Namely, in FIG. 25, the arranging interval of the bridge portion 213 is set to lengths L1, L2, L3 (L1<L2<L3). Thus, the impurity dose (the total amount of impurities of areas 4, 5) in the transversal direction of the PN column pair is periodically changed.

Figure 27A:
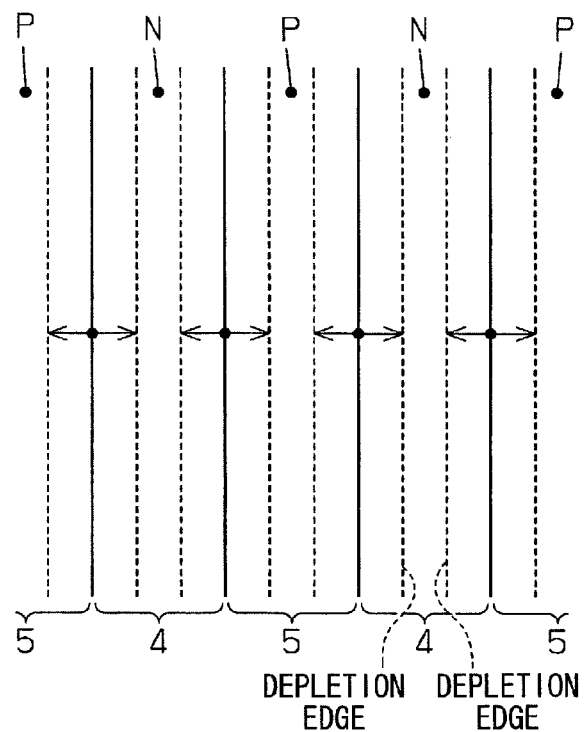
FIGS. 27A and 27B are cross sectional views showing a depletion layer in a semiconductor device having no bridge portion as a comparison of the fifth embodiment mode.
Figure 27B:
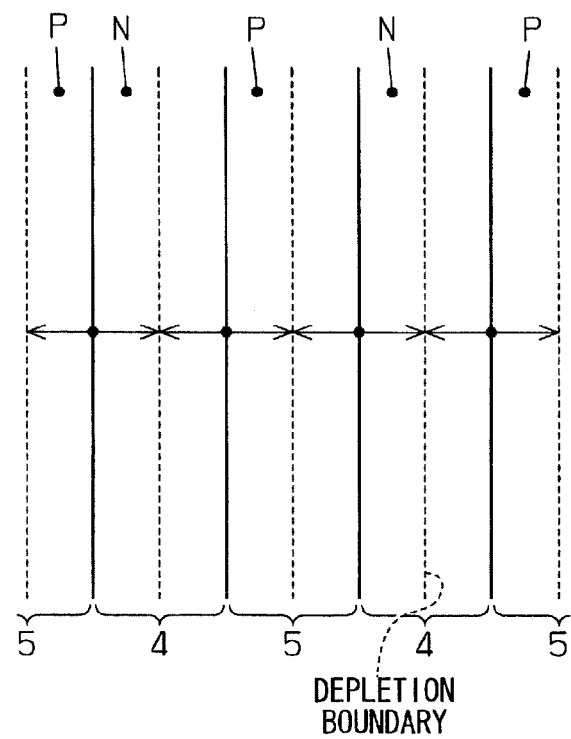

When no bridge portion 213 is arranged (when no adjacent N type impurity areas 4 are bridged), as shown in FIG. 27A, depletion formation is advanced in the column pair at a switching time (switching-off time) from an on-state of the transistor to an off-state. As shown in FIG. 27B, the depletion formation is simultaneously completed in the column pair (the depletion formation is instantly performed). In this operation, as shown in FIG. 23, at the switching time from an on-state to an off-state, a changing ratio (dI/dt) with respect to an electric current Ids between a drain and a source is large, and jumping-up of a voltage Vds between the drain and the source is generated.

Figure 26A:
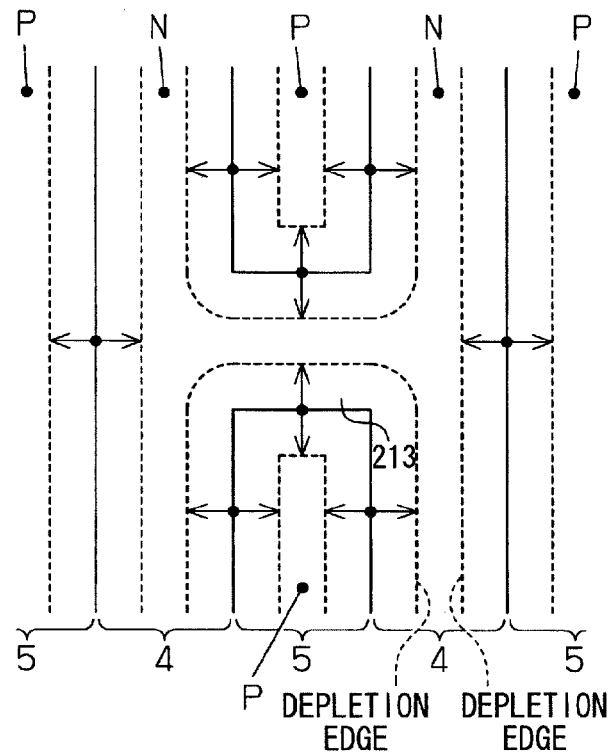
FIGS. 26A and 26B are cross sectional views showing a depletion layer in the device shown in FIG. 25.
Figure 26B:
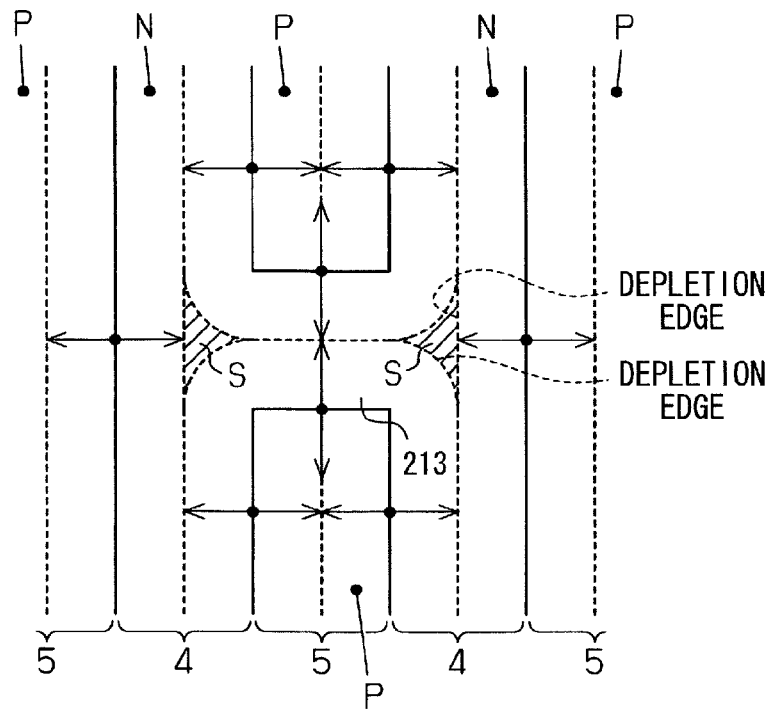

In contrast to this, in this embodiment mode, the bridge portion 213 is arranged (the adjacent N type impurity areas 4 are bridged), and the depletion formation is advanced in the column pair as shown in FIG. 26A at the switching time (switching-off time) from an on-state of the transistor to an off-state. As shown in FIG. 26B, no depletion formation is simultaneously completed in the column pair. In an area S shown by hatching in the bridge portion 213, no depletion formation is completed when the depletion formation is completed in other areas (timing of perfect depletion formation is intentionally shifted within the chip). Thus, at the switching time (switching-off time) from an on-state of the transistor to an off-state, the timing for perfectly depleting the PN column pair can be controlled within a transistor face. Therefore, as shown in FIG. 3, the changing ratio (dI/dt) with respect to the electric current Ids between the drain and the source is reduced, and the jumping-up of the voltage Vds between the drain and the source at the switching time from an on-state to an off-state can be deterred.

Namely, the impurity dose of the PN column pair is unbalanced in the bridge portion 213 and its circumference by forming the bridge portion 213, and the timing of the depletion formation is different. It is prevented that the perfect depletion formation is instantly performed within an element face. Further, noise generation at the switching time can be deterred, and recovery characteristics and a breakdown robustness amount of a built-in diode can be improved.

A manufacturing method of the semiconductor substrate having this super junction structure will next be explained.

Figure 28:
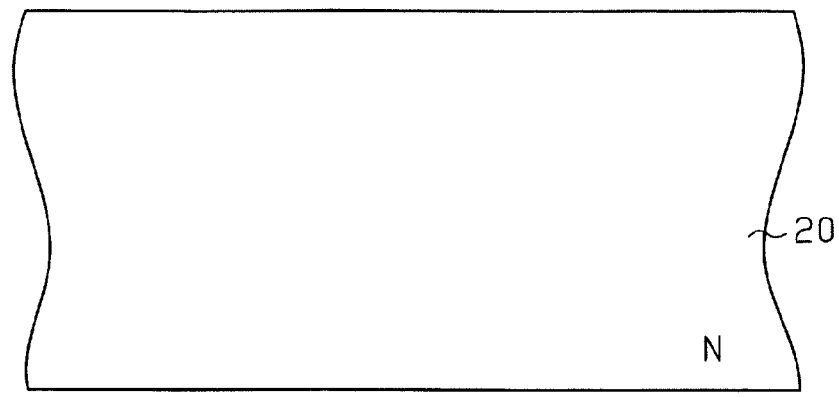
FIGS. 28-29 and 31-32 are cross sectional views explaining a method for manufacturing the device shown in FIG. 25.
Figure 29:
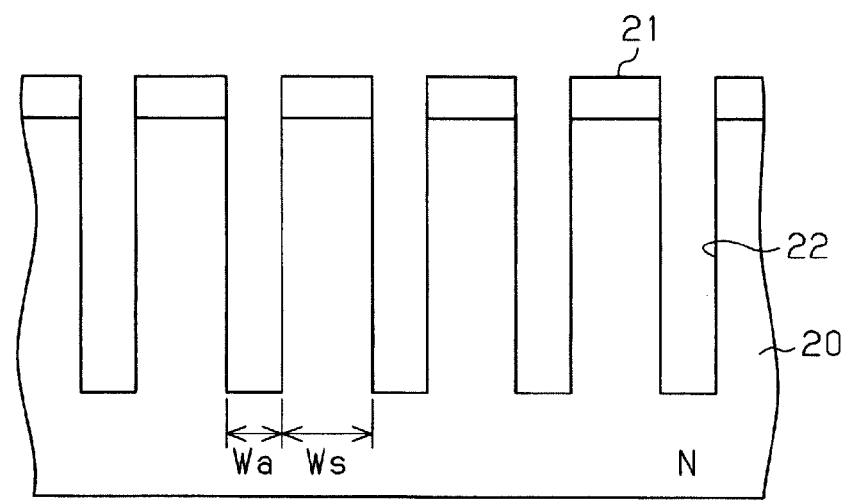

As shown in FIG. 28, an N type silicon wafer 20 as an N type semiconductor substrate is prepared. As shown in FIG. 29, a trench 22 of a constant groove width Wa is formed in the same direction (direction Y of FIG. 25) at a constant remaining width Ws by performing etching (dry etching or wet etching) using a mask 21 within a wafer face with respect to the wafer 20. When the trench is formed, the trench is formed so as to have the length of a transistor area or more in a depth direction (direction Y of FIG. 25).

Figure 30:
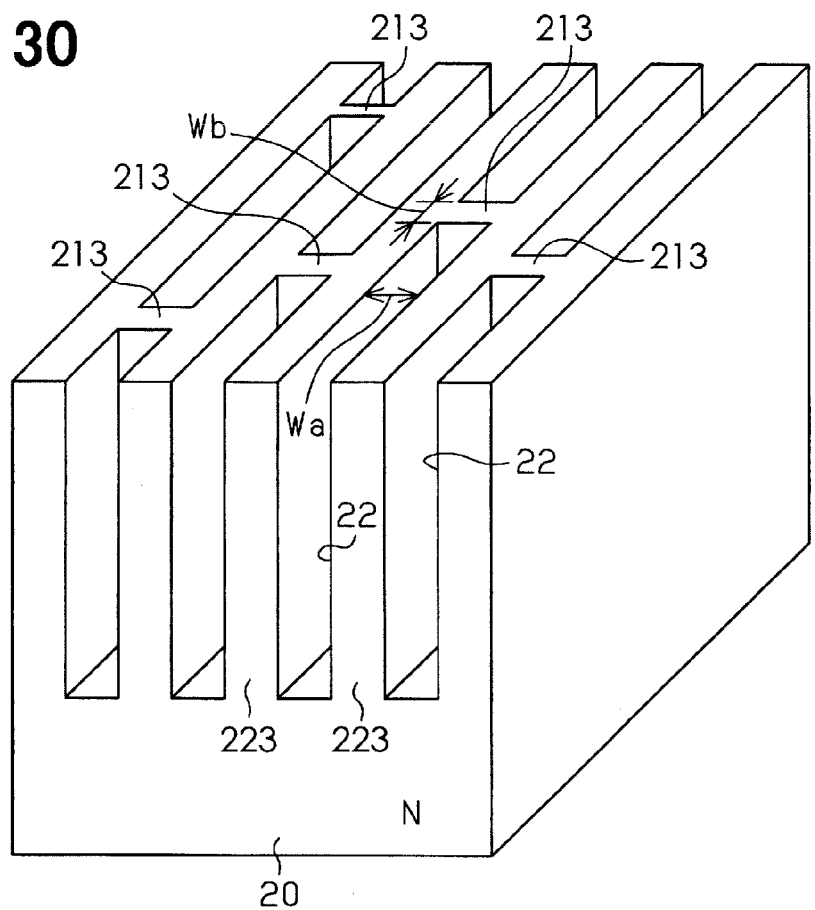
FIG. 30 is a perspective view explaining the method for manufacturing the device shown in FIG. 25.

In this embodiment mode, as shown in FIG. 30, in a forming process of the trench 22, the trench 22 is arranged in parallel to be intermittently extended, and the bridge portion 213, i.e., an area for digging no trench is partially arranged within the transistor area. The width Wb of the bridge portion 213 is set to the relation of Wb Wa with respect to the width Wa of the trench so as not to greatly reduce a device withstand voltage. Namely, when the trench 22 intermittently extended is formed, the width Wb of a part (bridge portion 213) interrupted with respect to the trench is set to the width Wa of the trench 22 or less.

Further, when the trench 22 intermittently extended is formed, i.e., when the trench 22 as the P type impurity area 5 in FIG. 25 is formed, the length L of a part continued with respect to the trench among the part (bridge portion 213) interrupted with respect to the trench and the part continued with respect to the trench is differently set in accordance with places.

Figure 31:
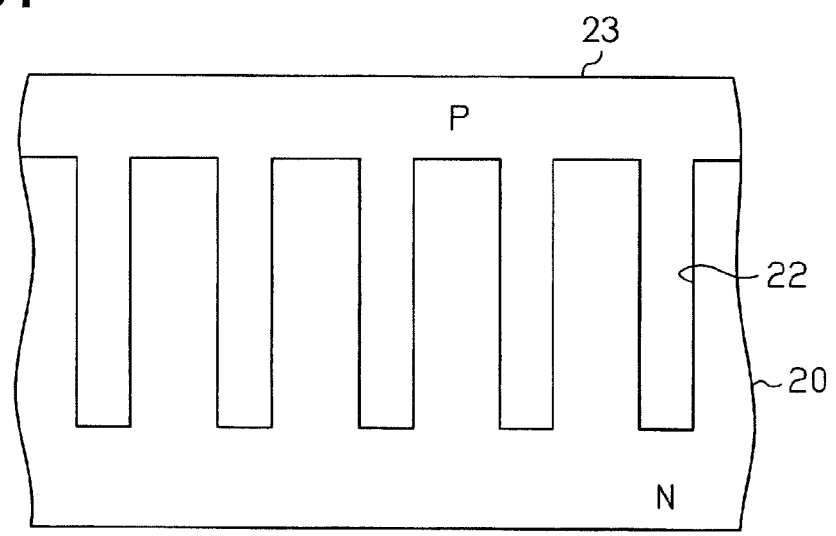

Thereafter, as shown in FIG. 31, an epitaxial film 23 of P type is formed on the N type silicon wafer 20, and the trench 22 is buried by the epitaxial film 23. Thereafter, a main face side (upper face side) of the N type silicon wafer 20, i.e., an upper face side of the epitaxial film 23 is polished and flattened. This polishing is performed until the silicon wafer 20 is exposed. The upper face side of the epitaxial film 23 may be also flattened by etch back instead of the polishing. Further, if epitaxial growth is controlled so as to flatten the upper face of the epitaxial film 23, flattening processing after epitaxy can be set to be unnecessary.

Figure 32:
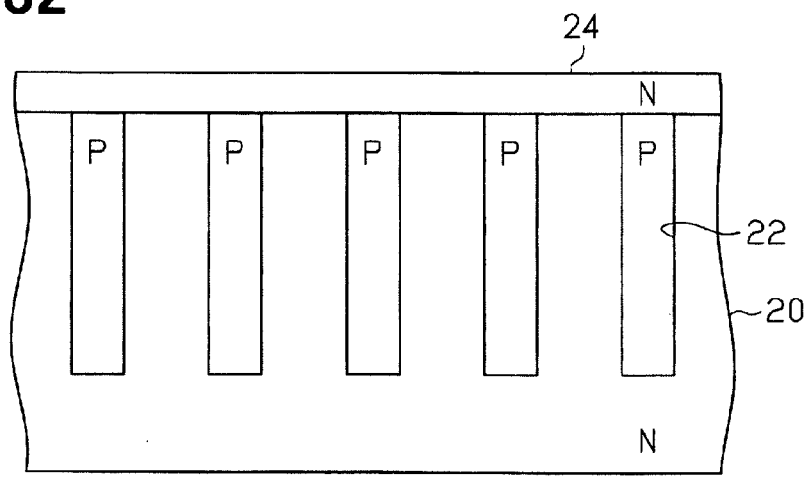

Further, as shown in FIG. 32, an N type epitaxial film 24 is formed on the upper face of the N type silicon wafer 20. A surface silicon layer of N type may be also formed by implanting ions on the upper face of the N type silicon wafer 20 instead of the formation of the N type epitaxial film 24 on the upper face of the N type silicon wafer 20.

Further, the rear face (lower face) of the N type silicon wafer 20 is polished until the vicinity of the trench 22, and an $N^+$ silicon substrate is stuck to this polishing face. An $N^+$ silicon layer may be also formed on the rear face of the N type silicon wafer 20 by implanting ions from the rear face (lower face) of the N type silicon wafer 20 instead of the polishing of the rear face of the N type silicon wafer 20 and the sticking of the $N^+$ silicon substrate.

The vertical type MOSFET shown in FIG. 24 is manufactured by using the semiconductor substrate (the semiconductor substrate having the super junction structure) formed in this way. Namely, a P type channel forming area 6, an N type source area 7, a gate oxide film 8, a gate electrode 9, a silicon oxide film 10, a source electrode 11 and a drain electrode 12 are formed. Thus, the super junction MOSFET of FIG. 24 is completed.

Here, a trench forming process and a burying process using epitaxy of the trench in the above manufacturing process will be referred.

Figure 34:
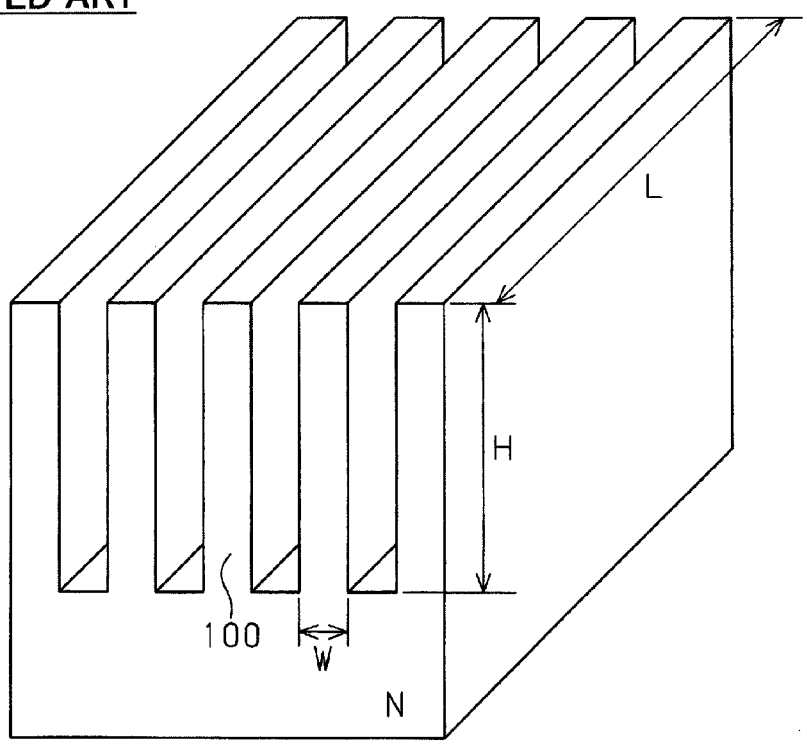
FIG. 34 is a perspective view showing the semiconductor device having no bridge portion as a comparison of the fifth embodiment mode.

In FIG. 34, in a device of middle and high withstand voltages (e.g., 200 to 300 volts or more), an aspect ratio (H/W) of a wall portion 100 becomes large. For example, the aspect ratio is "5" to "10" at a withstand voltage of 600 volts, and is "5" to "10" or more at a withstand voltage exceeding 1000 Volts. With respect to the length (L) of the trench, the trench is formed so as to be longer than a transistor area. Therefore, in the case of a power device for treating a large electric current, this length ranges from about 1 mm to ten and several mm. Therefore, there is a possibility that the trench wall 100 is inclined and falls at a wafer conveying time and a cleaning time before trench burying. Moreover, it is impossible to form a long trench reaching the diameter of the wafer since the fear of the inclination and falling of the trench wall is raised. Therefore, trench formation conformed to a chip size is compelled.

In this embodiment mode, the trench 22 is buried by epitaxial growth after the trench 22 of a stripe shape is formed. However, when the trench 22 of a stripe shape is formed, as shown in FIG. 30, it is possible to avoid that the trench wall 223 is inclined and falls before the trench burying by partially arranging the bridge portion (an area for digging no trench) 213 within the transistor area. Thus, it is possible to make the PN column pair of the same design in an entire area within the wafer face, and form the substrate trench not depending on the chip size.

In accordance with the above embodiment mode, the following effects can be obtained.

(1) In the semiconductor device (vertical type MOSFET) having the super junction structure, the impurity area (N column) 4 of N type and the impurity area (P column) 5 of P type constituting the column pair in the active area of the semiconductor device are formed in a band shape as a shape on a face perpendicular to the flowing direction of an electric current as shown in FIG. 25, and are alternately arranged in parallel in the same direction. The adjacent N type impurity areas (N column) 4 are bridged. Accordingly, as shown in FIGS. 26A and 26B, timing for perfectly depleting the column pair (PN column pair) constructed by the impurity area (N column) 4 of N type and the impurity area (P column) 5 of P type is shifted at the switching time (switching-off time) from an on-state to an off-state in the bridge portion 213 of the impurity area (N column) 4 of N type and its circumference on the face perpendicular to the flowing direction of the electric current. Thus, jumping-up of the voltage at the switching time from an on-state to an off-state can be restrained.

(2) A first process and a second process are included as the manufacturing method of the semiconductor substrate having the super junction structure. As shown in FIGS. 29 and 30, in the first process, the trench 22 of a constant groove width Wa is arranged in parallel by etching in the silicon wafer 20 of N type so as to be intermittently extended in the same direction at a constant remaining width Ws. As shown in FIG. 31, in the second process, the epitaxial film 23 of P type is formed on the silicon wafer 20 of N type, and the trench 22 is buried by this epitaxial film 23. Accordingly, the substrate for the semiconductor device of the above (1) can be easily obtained. Further, in manufacture, the aspect ratio of a wall portion after the trench formation becomes large, and a wall is easily inclined and easily falls before the burying using epitaxial growth. However, in this embodiment mode, the trench 22 of the constant groove width Wa is arranged in parallel so as to be intermittently extended in the same direction at the constant remaining width Ws. Accordingly, it is possible to prevent that the trench wall is inclined and falls. Thus, the PN column pair of the same design can be made in the entire area within the wafer face, and the substrate trench not depending on the chip size can be formed.

(3) In particular, in (1), as shown in FIG. 25, the width Wb of the bridge portion 213 is set to the width Wa of the P type impurity area 5 nipped between the bridged N type impurity areas 4 or less. Accordingly, an area shown by reference numeral S in FIG. 26B is reduced and a great reduction in the withstand voltage of the device can be prevented. Therefore, it is sufficient to set the width Wb of a part (bridge portion 213) interrupted with respect to the trench to the width Wa of the trench 22 or less in forming the trench 22 intermittently extended in the above first process.

Further, as shown in FIG. 25, plural bridge portions 213 are arranged in an extending direction of the N type impurity area 4 with respect to the adjacent N type impurity areas 4, and the length L between the bridge portions 213 is differently set in accordance with places. Accordingly, the bridge portion 213 can be arranged by periodically changing the length between the bridge portions, and can be also irregularly arranged on a face perpendicular to the flowing direction of an electric current. Thus, optimization in shifting depletion formation timing (depletion formation timing is gradually shifted, etc.) can be performed within the active area, and a larger effect is obtained. Therefore, when the trench 22 intermittently extended is formed in the above first process, it is sufficient to differently set the length L of a part continued with respect to the trench among a part (bridge portion 213) interrupted with respect to the trench and the part continued with respect to the trench in accordance with places.

Sixth Embodiment Mode

A sixth embodiment mode will next be explained with a focus on a different point from the fifth embodiment mode.

Figure 33:
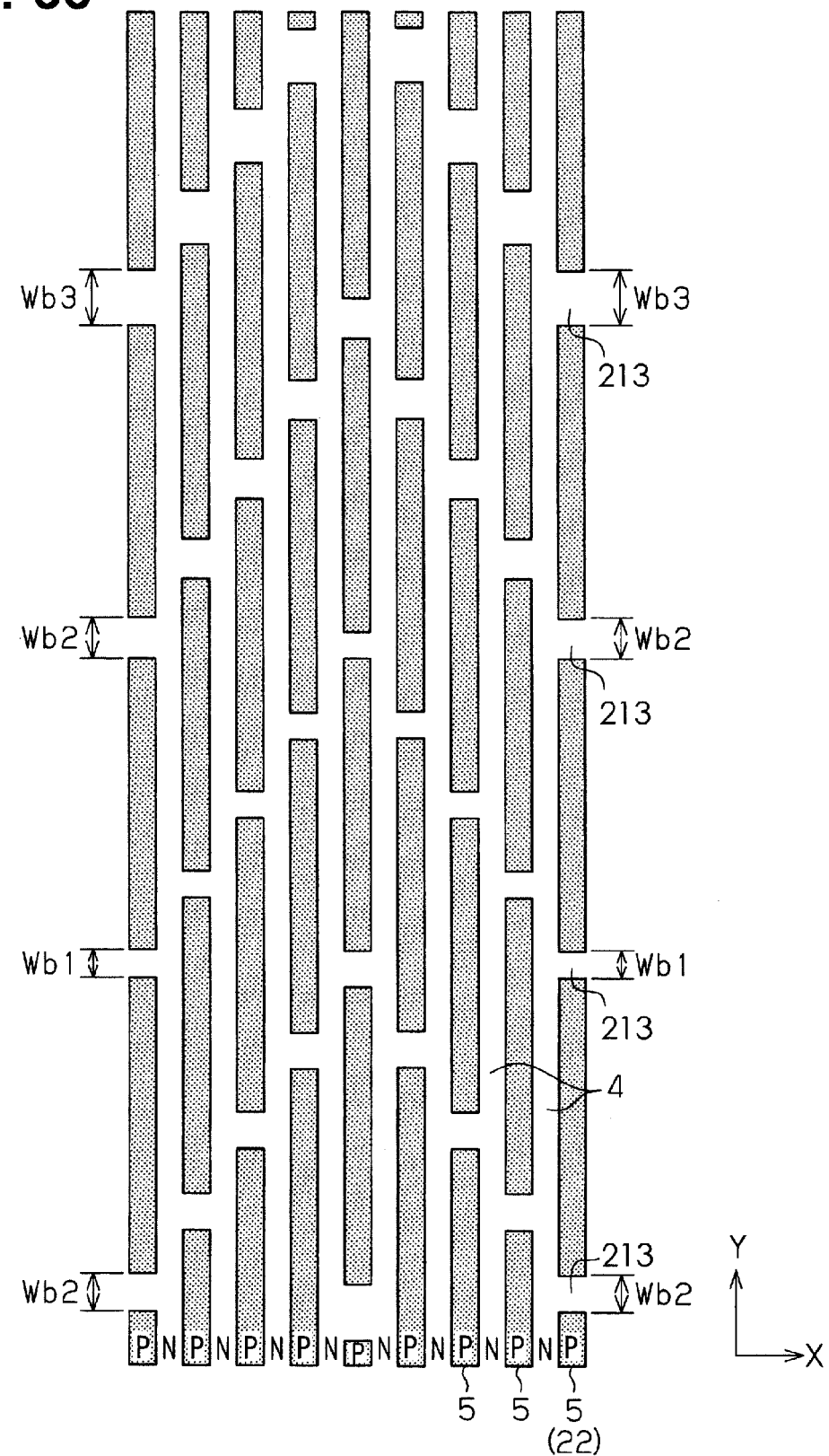
FIG. 33 is a cross sectional view showing a semiconductor device according to a sixth embodiment mode.

This embodiment mode is set to a construction shown in FIG. 33 instead of FIG. 25.

In FIG. 33, the bridge portion 213 is periodically arranged as a forming position of the bridge portion 213, and the width Wb of the bridge portion 213 is set so as to be sequentially increased in the order of Wb1, Wb2, Wb3 (Wb1<Wb2<Wb3).

Namely, plural bridge portions 213 are arranged in the extending direction (direction Y) of the N type impurity area 4 with respect to the adjacent N type impurity areas 4, and the width Wb of the bridge portion 213 is differently set in accordance with places. Therefore, when the trench 22 intermittently extended is formed in the above first process, the width Wb of a part (bridge portion 213) interrupted with respect to the trench among the part (bridge portion 213) interrupted with respect to the trench and a part continued with respect to the trench is differently set in accordance with places. Thus, timing for performing perfect depletion formation in each bridge portion in a cross section (a face perpendicular to the flowing direction of an electric current) can be shifted. Thus, optimization in shifting the timing for depleting the adjacent bridge portion (the timing for depleting the adjacent bridge portion is gradually shifted, etc.) can be performed, and a larger effect is obtained.

With respect to the bridged N type impurity area 4, as explained in the fifth embodiment mode, plural bridge portions 213 may be arranged in the extending direction of the impurity area 4 with respect to the adjacent impurity areas 4, and the length L between the bridge portions 213 may be also differently set in accordance with places. Further, as explained in the sixth embodiment mode, the width Wb of the bridge portion 213 may be also differently set in accordance with places. Thus, a more detailed design can be made.

The above embodiment mode may be also set as follows.

In FIG. 25, etc., the adjacent N type impurity areas (N column) 4 are bridged, but adjacent P type impurity areas (N column) 5 may be also bridged.

In the explanation made so far, the first electric conductivity type is the N type, and the second electric conductivity type is the P type. However, conversely, the first electric conductivity type may be also the P type and the second electric conductivity type may be also the N type. Namely, in FIG. 24, the P column of the column pair may be also set to a drift area as the P channel MOSFET.

Further, MOSFET of the planar type has been explained as an example, but similar effects are also obtained in a concave type and a trench type.

Further, the above embodiments may be also applied to IGBT and a diode in addition to MOSFET.

The above disclosure has the following aspects.

According to a first aspect of the present disclosure, a semiconductor device having a super junction structure includes: a plurality of first columns having a first conductive type and extending in a current flowing direction; and a plurality of second columns having a second conductive type and extending in the current flowing direction. The first columns and the second columns are alternately arranged in an alternating direction perpendicular to the current flowing direction so that the super junction structure is provided. Each first column provides a drift layer in case of an on-state for flowing a current therethrough. The first columns and the second columns have a boundary between the first column and the second column, from which a depletion layer expands in case of an off-state. At least one of the first columns and the second columns have an impurity dose, which is inhomogeneous by location with respect to the alternating direction.

When the device switches from the on-state to the off-state, a timing of complete depleting the first and second columns deviates by location with respect to the alternating direction. Thus, voltage jump is reduced when the device switches to the off-state.

Alternatively, each first column may have a first impurity concentration, and each second column may have a second impurity concentration. At least one of the first impurity concentration and the second impurity concentration varies by location with respect to the alternating direction.

Alternatively, each first column may have a first width in the alternating direction, and each second column may have a second width in the alternative direction. At least one of the first width and the second width varies by location with respect to the alternating direction.

Alternatively, each first column may have a first width in the alternating direction, and the first width is constant by location with respect to the alternating direction. Each second column may have a second width in the alternative direction, and the second width is constant by location with respect to the alternating direction. Each first column may have a first impurity concentration, and each second column may have a second impurity concentration. The first impurity concentration and the second impurity concentration vary by location with respect to the alternating direction.

Alternatively, each first column may have a first width in the alternating direction, and the first width is constant by location with respect to the alternating direction. Each second column may have a second width in the alternative direction, and the second width is constant by location with respect to the alternating direction. Each first column may have a first impurity concentration, and each second column may have a second impurity concentration. The first impurity concentration varies by location with respect to the alternating direction, and the second impurity concentration is constant by location with respect to the alternating direction.

Alternatively, each first column may have a first impurity concentration, and the first impurity concentration is constant by location with respect to the alternating direction. Each second column may have a second impurity concentration, and the second impurity concentration is constant by location with respect to the alternating direction. Each first column may have a first width in the alternating direction, and each second column may have a second width in the alternative direction. The first width varies by location with respect to the alternating direction, and the second width is constant by location with respect to the alternating direction.

Alternatively, at least one of the impurity doses of the first columns and the second columns may include a first dose and a second dose. The device has a maximum breakdown voltage when the one of the impurity doses is a predetermined optimum impurity dose. The first dose is higher than the optimum impurity dose by a predetermined value. The surface second density is lower than the optimum impurity dose by the predetermined value. In this case, the breakdown voltage of the device is improved, i.e., the breakdown voltage of the device is prevented from being locally reduced.

Alternatively, at least one of the impurity doses of the first columns and the second columns may include a first dose, at least one middle dose and a second dose. The device has a maximum breakdown voltage when the one of the impurity doses is a predetermined optimum impurity dose. The first dose is higher than the optimum impurity dose by a predetermined value. The surface second density is lower than the optimum impurity dose by the predetermined value. The middle dose is disposed in a region between the first dose and the second dose.

Alternatively, the device may be a vertical type MOSFET or a lateral type MOSFET.

According to a second aspect of the present disclosure, a semiconductor device having a super junction structure includes: a plurality of first columns having a first conductive type and extending in a current flowing direction; and a plurality of second columns having a second conductive type and extending in the current flowing direction. The first columns and the second columns are alternately arranged in an alternating direction perpendicular to the current flowing direction so that the super junction structure is provided. Each first column provides a drift layer in case of an on-state for flowing a current therein. The first columns and the second columns have a boundary between the first column and the second column, from which a depletion layer expands in case of an off-state. At least one of the first columns and the second columns have an impurity dose, which is inhomogeneous by location with respect to the current flowing direction.

When the device switches from the on-state to the off-state, a timing of complete depleting the first and second columns deviates by location with respect to the current flowing direction. Thus, voltage jump is reduced when the device switches to the off-state.

Alternatively, each first column may have a first impurity concentration, and the first impurity concentration is constant by location with respect to the alternating direction. Each second column may have a second impurity concentration, and the second impurity concentration is constant by location with respect to the alternating direction. Each first column may have a first width in the alternating direction, and each second column may have a second width in the alternative direction. The first width and the second width vary by location with respect to the current flowing direction.

According to a third aspect of the present disclosure, a method for manufacturing a semiconductor device having a super junction structure includes: preparing a semiconductor substrate having a first conductive type; forming a plurality of trenches in the substrate, wherein each trench has a constant width along with a first direction, and wherein a distance between neighboring two trenches along with the first direction includes at least a first distance and a second distance; forming an epitaxial film having a second conductive type on the substrate so that the trenches are filled with the epitaxial film; and flattening one side of the substrate, on which the epitaxial film is formed.

The above method provides the semiconductor device, in which voltage jump is reduced when the device switches to the off-state.

According to a fourth aspect of the present disclosure, a semiconductor device having a super junction structure includes: a plurality of first columns having a first conductive type and extending in a current flowing direction; and a plurality of second columns having a second conductive type and extending in the current flowing direction. The first columns and the second columns are alternately arranged in an alternating direction perpendicular to the current flowing direction so that the super junction structure is provided. Each first column provides a drift layer in case of an on-state for flowing a current therethrough. The first columns and the second columns have a boundary between the first column and the second column, from which a depletion layer expands in case of an off-state. Each of the first columns and the second columns have a stripe planar pattern on a plane perpendicular to the current flowing direction. At least one of the first columns and the second columns have a bridge portion, which connects one first or second column and a neighboring first or second column.

When the device switches from the on-state to the off-state, a timing of complete depleting the first and second columns deviates by location. Thus, voltage jump is reduced when the device switches to the off-state.

Alternatively, the other one of the first columns and the second columns may have a width along with the alternating direction. The bridge portion has a width along with an extending direction of the stripe planar pattern, which is perpendicular to the alternating direction, and the width of the bridge portion is smaller than the width of the other one of the first columns and the second columns. In this case, the breakdown voltage of the device is improved.

Alternatively, the bridge portion may include a plurality of bridge elements. The bridge elements have a distance between one bridge element and a neighboring bridge element along with an extending direction of the stripe planar pattern, which is perpendicular to the alternating direction, and the distance of the bridge elements varies by location. In this case, the bridge elements may be periodically arranged or randomly arranged, so that the timing of complete depleting the first and second columns is optimized. Thus, voltage jump is effectively reduced when the device switches to the off-state.

Alternatively, the bridge portion may include a plurality of bridge elements. Each bridge element has a width along with an extending direction of the stripe planar pattern, which is perpendicular to the alternating direction, and the width of the bridge elements varies by location.

According to a fifth aspect of the present disclosure, a method for manufacturing a semiconductor device having a super junction structure includes: preparing a semiconductor substrate having a first conductive type; forming a plurality of trenches in the substrate, wherein each trench has a constant width along with a first direction, wherein the trenches have a constant distance between neighboring two trenches along with the first direction, and wherein each trench extends intermittently in a second direction, which is perpendicular to the first direction; and forming an epitaxial film having a second conductive type on the substrate so that the trenches are filled with the epitaxial film.

The above method provides the semiconductor device, in which voltage jump is reduced when the device switches to the off-state. Further, since the trenches have the constant distance between neighboring two trenches, and each trench extends intermittently in the second direction, a trench wall is prevented from inclining.

Alternatively, the trenches may have a break portion, at which extending of the trenches stops. The break portion has a width along with the second direction, and the width of the break portion is smaller than the constant width of the trenches.

Alternatively, the trenches may have a plurality of break portions, at which extending of the trenches stops. The break portions have a distance between one break portion and a neighboring break portion along with the second direction, and the distance of the break portions varies by location.

Alternatively, the trenches may have a plurality of break portions, at which extending of the trenches stops. Each break portion has a width along with the second direction, and the width of the break portions varies by location.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A semiconductor device having a super junction structure comprising:
   a plurality of first columns having a first conductive type and extending in a current flowing direction; and
   a plurality of second columns having a second conductive type and extending in the current flowing direction, wherein
   the first columns and the second columns are alternately arranged in an alternating direction perpendicular to the current flowing direction so that the super junction structure is provided,
   each first column provides a drift layer in case of an on-state for flowing a current therethrough,
   the first columns and the second columns have a boundary between the first column and the second column, from which a depletion layer expands in case of an off-state, and
   in at least one of the first columns and the second columns in a transistor-forming area, a total amount of impurities in corresponding columns are different by location with respect to the alternating direction.

2. The device according to claim 1, wherein
   each first column has a first width in the alternating direction, each second column has a second width in the alternative direction, and at least one of the first width and the second width varies by location with respect to the alternating direction.

3. The device according to claim 2, wherein the first width of each of the first columns has one of: a narrow width, a middle width that is greater than the narrow width, and a wide width that is greater than the middle width.

4. The device according to claim 1, wherein each first column has a first impurity concentration, the first impurity concentration is constant by location with respect to the alternating direction, each second column has a second impurity concentration, the second impurity concentration is constant by location with respect to the alternating direction, each first column has a first width in the alternating direction, each second column has a second width in the alternative direction, the first width varies by location with respect to the alternating direction, and the second width is constant by location with respect to the alternating direction.

5. The device according to claim 4, wherein the first width of each of the first columns has one of: a narrow width, a middle width that is greater than the narrow width, and a wide width that is greater than the middle width.

6. The device according to claim 1, wherein at least one of the total amount of impurities of the first columns and the second columns includes a first dose and a second dose, the device has a maximum breakdown voltage when the one of the total amount of impurities is a predetermined optimum impurity dose, the first dose is higher than the optimum impurity dose by a predetermined value, and the surface second density is lower than the optimum impurity dose by the predetermined value.

7. The device according to claim 1, wherein at least one of the total amount of impurities of the first columns and the second columns includes a first total amount of impurities, at least one middle total amount of impurities, and a second total amount of impurities, the device has a maximum breakdown voltage when the one of the total amount of impurities is a predetermined optimum total amount of impurities, the first total amount of impurities is higher than the optimum total amount of impurities by a predetermined value, the surface second density is lower than the optimum total amount of impurities by the predetermined value, and the middle total amount of impurities is disposed in a region between the first total amount of impurities and the second total amount of impurities.

8. The device according to claim 1, wherein the device is a vertical type MOSFET or a lateral type MOSFET.

9. The device according to claim 1, wherein in at least one of the first columns and the second columns in an interior portion of the transistor-forming area, a total amount of impurities in corresponding columns are different by location with respect to the alternating direction.

10. The device according to claim 1, wherein each first column in the transistor-forming area has a first width in the alternating direction, each second column in the transistor-forming area will has a second width in the alternative direction, and at least one of the first width and the second width varies by location with respect to the alternating direction.

11. The device according to claim 1, wherein each first column in the transistor-forming area has a first impurity concentration, the first impurity concentration is constant by location with respect to the alternating direction, each second column in the transistor-forming area has a second impurity concentration, the second impurity concentration is constant by location with respect to the alternating direction, each first column in the transistor-forming area has a first width in the alternating direction, each second column in the transistor-forming area has a second width in the alternative direction, the first width varies by location with respect to the alternating direction, and the second width is constant by location with respect to the alternating direction.

\* \* \* \* \*